(12) United States Patent
Fukae

(10) Patent No.: US 12,490,442 B2
(45) Date of Patent: Dec. 2, 2025

(54) CHIP PARTS

(71) Applicant: ROHM CO., LTD., Kyoto (JP)

(72) Inventor: Keisuke Fukae, Kyoto (JP)

(73) Assignee: ROHM CO., LTD., Kyoto (JP)

( * ) Notice: Subject to any disclaimer, the term of this patent is extended or adjusted under 35 U.S.C. 154(b) by 562 days.

(21) Appl. No.: 17/948,793

(22) Filed: Sep. 20, 2022

(65) Prior Publication Data

US 2023/0102582 A1 Mar. 30, 2023

(30) Foreign Application Priority Data

Sep. 29, 2021 (JP) .................................. 2021-160042

(51) Int. Cl.
*H10D 1/66* (2025.01)
*H01L 23/00* (2006.01)
(Continued)

(52) U.S. Cl.
CPC ............. *H10D 1/665* (2025.01); *H01L 24/04* (2013.01); *H01L 24/05* (2013.01); *H01L 24/06* (2013.01);
(Continued)

(58) Field of Classification Search
CPC ........ H10D 1/665; H10D 1/047; H10D 64/01; H10D 64/23; H01L 24/04; H01L 24/05; H01L 24/06; H01L 24/03; H01L 2224/0345; H01L 2224/0346; H01L 2224/04042; H01L 2224/05012; H01L 2224/05018; H01L 2224/05082; H01L 2224/05144; H01L 2224/05166; H01L 2224/05564; H01L 2224/05573; H01L 2224/05583; H01L 2224/05644;
(Continued)

(56) References Cited

U.S. PATENT DOCUMENTS 8,283,750 B2 * 10/2012 Guiraud ................. H10D 1/047
257/528
10,026,557 B2 * 7/2018 Yamamoto ............. H10D 1/048
(Continued)

FOREIGN PATENT DOCUMENTS

| JP | H1145843 A | 6/1989 |
| JP | 2008251972 A | 10/2008 |

(Continued)

OTHER PUBLICATIONS

Japanese Office Action for JP Application 2021-160042A issued by the Japanese Patent Office on May 29, 2025 with search report, both with translation.

*Primary Examiner* — Steven B Gauthier
*Assistant Examiner* — Khatib A Rahman
(74) *Attorney, Agent, or Firm* — Rabin & Berdo, P.C.

(57) ABSTRACT

The present disclosure provides a chip part. The chip part includes: a capacitor portion, including a plurality of wall portions separated from each other by a plurality of trenches formed on the first main surface and having a lengthwise direction; a substrate body, formed around the capacitor portion using a portion of the semiconductor substrate; a lower electrode, disposed using at least a portion of the semiconductor substrate including the wall portions; a capacitive film, disposed along top and side surfaces of the plurality of wall portions; and an upper electrode, disposed on the capacitive film.

18 Claims, 23 Drawing Sheets

(51) Int. Cl.
  *H10D 1/00* (2025.01)
  *H10D 64/01* (2025.01)
  *H10D 64/23* (2025.01)

(52) U.S. Cl.
  CPC ............. *H10D 1/047* (2025.01); *H10D 64/01* (2025.01); *H10D 64/23* (2025.01); *H01L 24/03* (2013.01); *H01L 2224/0345* (2013.01); *H01L 2224/0346* (2013.01); *H01L 2224/04042* (2013.01); *H01L 2224/05012* (2013.01); *H01L 2224/05018* (2013.01); *H01L 2224/05082* (2013.01); *H01L 2224/05144* (2013.01); *H01L 2224/05166* (2013.01); *H01L 2224/05564* (2013.01); *H01L 2224/05573* (2013.01); *H01L 2224/05583* (2013.01); *H01L 2224/05644* (2013.01); *H01L 2224/05655* (2013.01); *H01L 2224/05664* (2013.01); *H01L 2224/0603* (2013.01); *H01L 2224/06181* (2013.01)

(58) Field of Classification Search
  CPC . H01L 2224/05655; H01L 2224/05664; H01L 2224/0603; H01L 2224/06181
  See application file for complete search history.

(56) References Cited

U.S. PATENT DOCUMENTS

| | | | | |
|---|---|---|---|---|
| 10,706,993 | B2* | 7/2020 | Shimoichi | H01F 17/0006 |
| 10,903,309 | B2* | 1/2021 | Takeuchi | H01G 4/33 |
| 11,342,125 | B2* | 5/2022 | Fukae | H10D 1/712 |
| 11,844,208 | B2* | 12/2023 | Sukekawa | H10B 12/0335 |
| 11,955,568 | B2* | 4/2024 | Buffle | H10D 1/047 |
| 2017/0104057 | A1* | 4/2017 | Voiron | H10D 1/042 |

FOREIGN PATENT DOCUMENTS

| | | |
|---|---|---|
| JP | 2017-195322 A | 10/2017 |
| JP | 2021028974 A | 2/2021 |

\* cited by examiner

CHIP PARTS

TECHNICAL FIELD

The present disclosure relates to chip parts.

BACKGROUND

Patent document 1 discloses a chip capacitor including a substrate, a first conductive film and a first pad film formed on the substrate, a dielectric layer formed on the first conductive film and the first pad film, and a second conductive film formed on the dielectric film and including a second connection region and a second capacitor forming region. The first conductive film includes a first connection region and a first capacitor forming region. A first external electrode is bonded to the first connection region of the first conductive film, and a second external electrode is bonded to the second connection region of the second conductive film.

PRIOR ART DOCUMENT

Patent Publication

[Patent document 1] Japan Patent Publication No. 2017-195322

SUMMARY

Problems to be Solved by the Disclosure

A chip part is provided according to an embodiment of the present disclosure. The chip part is capable of efficiently utilizing the lateral space of a semiconductor substrate and ensuring a larger capacitance for a capacitor.

A chip par is further provided according to an embodiment of the present disclosure. The chip part is capable of ensuring a larger capacitance for a capacitor, maintaining stability of wall portions and enhancing stability of components.

Technical Means for Solving the Problem

A chip part according to an embodiment of the present disclosure includes: a semiconductor substrate, having a first main surface and a second main surface opposite to the first main surface; a capacitor portion, disposed on the first main surface of the substrate when viewed from a plan view and along a normal direction of the first main surface, wherein the capacitor portion includes a plurality of wall portions having a lengthwise direction and separated from each other by a trench formed on the first main surface; a substrate body, formed around the capacitor portion using a portion of the semiconductor substrate, and connected to at least one of one end and another end of the plurality of wall portions in the lengthwise direction; a lower electrode, disposed using at least a portion of the semiconductor substrate including the plurality of wall portions; a capacitive film, disposed along top and side surfaces of the plurality of wall portions; and an upper electrode, disposed on the capacitive film. The plurality of wall portions are formed of a plurality of pillar units, each of the plurality of pillar units includes a central portion and three protruding portions extending from the central portion to three different directions in the plan view, and the plurality of wall portions are formed by connecting the three protruding portions of adjacent pillar units.

Effects of the Disclosure

In the chip part according to an embodiment of the present disclosure, the upper electrode and the semiconductor substrate (the lower electrode) face each other across the capacitive film. Thus, a vertical capacitor having a laminated structure of the upper electrode capacitive film-lower electrode is formed in the lengthwise direction along the thickness direction of the semiconductor substrate. With the vertical capacitor, the external electrode used for the upper electrode can be disposed on the first main surface and the external electrode used for the lower electrode can be disposed on the second main surface. Hence, it is not necessary to arrange these external electrodes along the lateral direction of the first main surface of the semiconductor substrate. Therefore, the lateral space of the semiconductor substrate can be efficiently utilized, thereby providing the small-size chip part.

Moreover, the wall portions disposed at the semiconductor substrate are formed by the plurality of pillar units, Each of the plurality of pillar units includes a central portion, and three protruding portions extending from the central portion to three different directions in the plan view. Thus, compared to when the wall portions are formed by connecting pillars such as quadrilateral pillars, the surface area of the wall portions can be increased. Moreover, the capacitor portion is formed by imitating the surfaces of the wall portions. Thus, the capacitance of the capacitor portion is not limited by the plane size of the semiconductor substrate, and a large capacitance can be realized by increasing the height of the wall portions. That is to say, even if the plane size of the semiconductor substrate is smaller, it is ensured that the capacitor portion has a larger capacitance.

In addition, if the wall portions are formed by connecting the plurality of pillar units, the stability achieved is better than that achieved by pillar units separated from each other. Further, at least one of one end and another end of each wall portion is connected to the substrate body portion around the wall portion. Thus, the wall portions can be cantilevered at least from the side and therefore can be reinforced to withstand lateral forces applied to the wall portions. As a result, even if the height of the wall portions is increased, the stability of the wall portions can still be maintained, thereby enhancing component reliability.

DETAILED DESCRIPTION OF THE EMBODIMENTS

Details of the embodiments of the present disclosure are given with the accompanying drawings below.

[Appearance of Chip Part 1]

Figure 1:
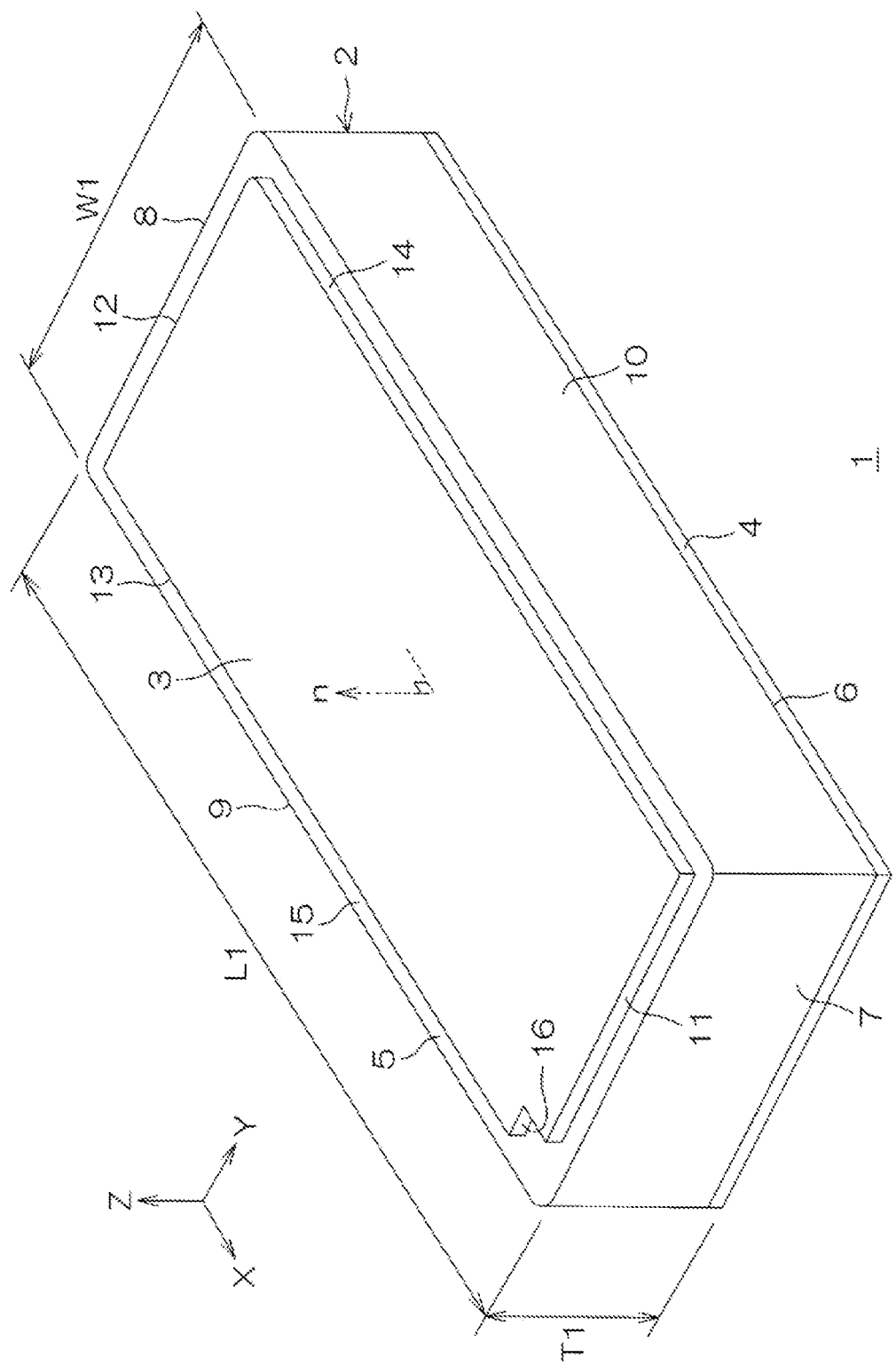
FIG. 1 is a perspective schematic diagram of a chip part according to an embodiment of the present disclosure.
Figure 2:
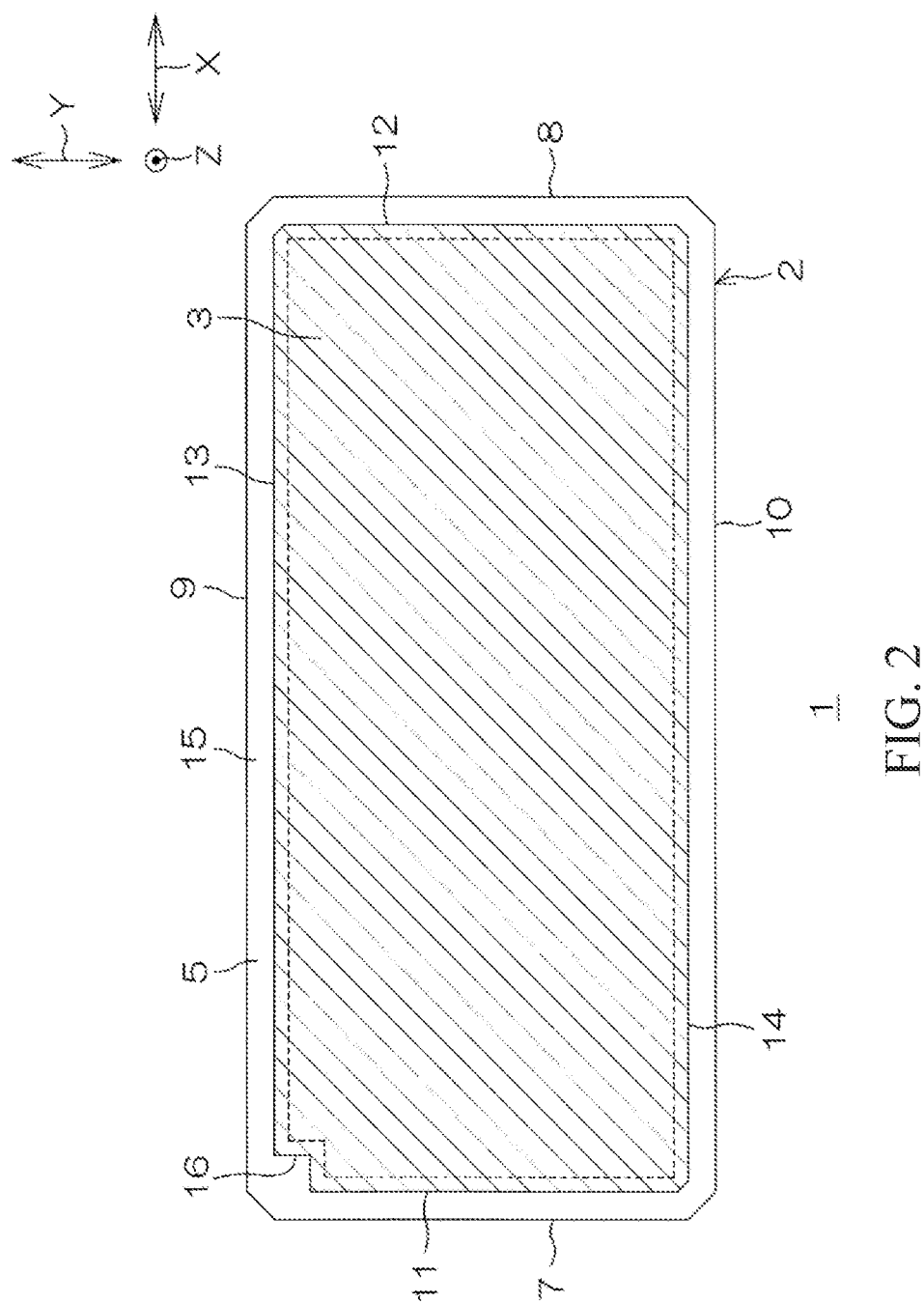
FIG. 2 is a schematic top view of the chip part.
Figure 3:
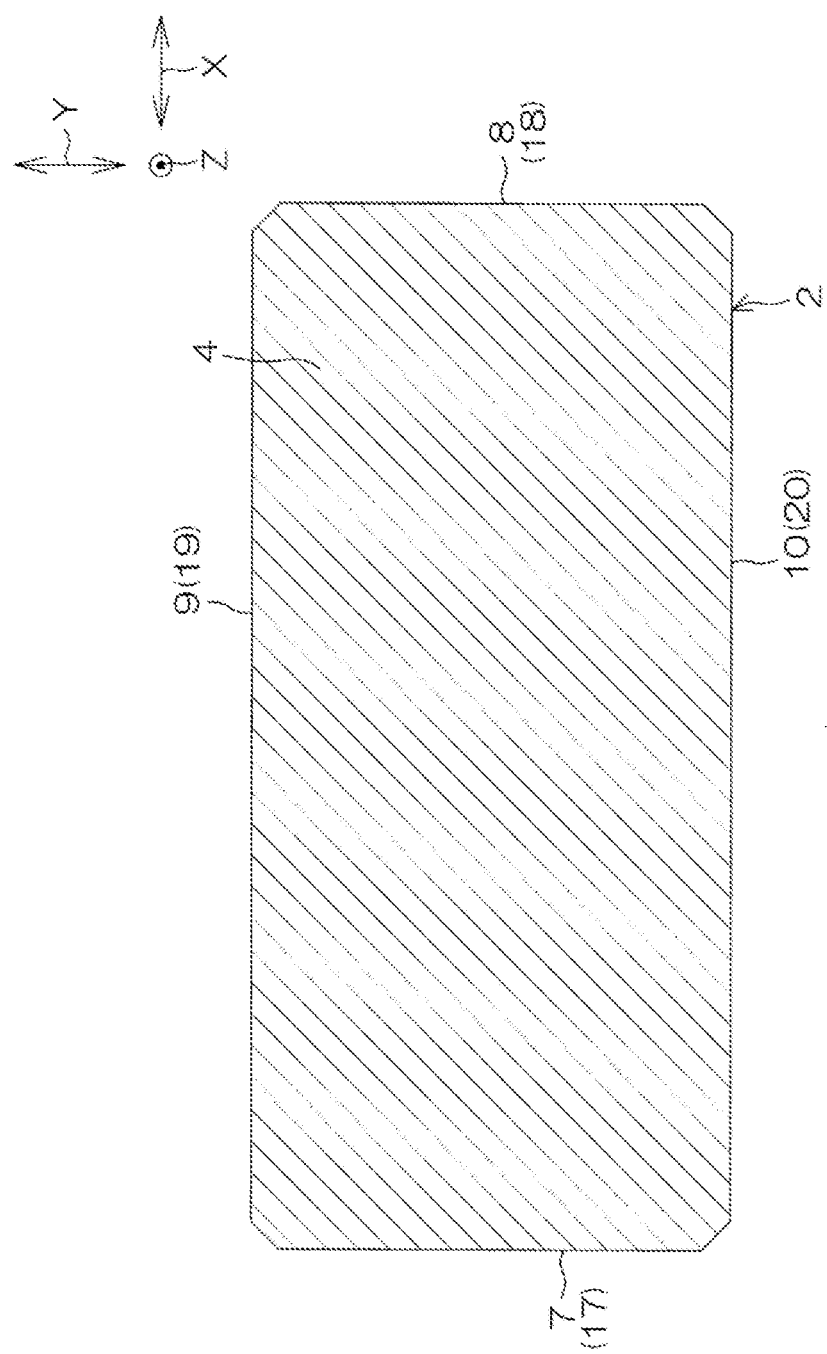
FIG. 3 is a schematic bottom view of the chip part.

FIG. 1 shows a perspective schematic diagram of a chip part 1 according to an embodiment of the present disclosure. FIG. 2 shows a schematic top view of the chip part 1. FIG. 3 shows a schematic bottom view of the chip part 1. In FIG. 1 and FIG. 2, the lengthwise direction of the chip part 1 having a cuboid shape is defined as a first direction X, the widthwise direction of the chip part 1 is defined as a second direction Y, and a thickness direction of the chip part 1 is defined as a third direction Z. Moreover, in FIG. 2 and FIG. 3, for clarity, a first external electrode 3 and a second external electrode 4 are shaded by lines.

The chip part 1 is formed in a cuboid shape, and has a length L1 along the first direction X, a width W1 along the second direction Y and a thickness T1 along the third direction Z. The length L1 may be, for example, between 0.4 mm and 2 mm. The width W1 may be, for example, between 0.2 mm and 2 mm. The thickness T1 may be, for example, between 0.1 mm and 0.5 mm.

The chip part 1 may also be a small-size electronic component using a chip designation (length L1 (mm)×width W1 (mm)), for example, referred to as a 1608 (1.6 mm×0.8 mm) chip, a 1005 (1.00 mm×0.5 mm) chip, 0603 (0.6 mm×0.3 mm) chip, 0402 (0.4 mm 0.2 mm) chip, or 03015 (0.3 mm×0.15 mm) chip.

The chip part 1 includes a substrate 2, a first external electrode 3 and a second external electrode 4.

The substrate 2 forms a base substrate of the chip part 1. The chip part 1 is formed by supporting a plurality of insulating films and metal films laminated on each other on the substrate 2. The substrate 2 exhibits a cuboid shape having substantially the same dimensions as the chip part 1. In this embodiment, the substrate 2 may also be a semiconductor substrate such as a silicon substrate. The thickness of the substrate 2 may be, for example, between 200 μm and 600 μm.

The substrate 2 has a first main surface 5, a second main surface 6 and four side surfaces 7 to 10. The first main surface 5 is the so-called front side of the chip part 1, and the second main surface 6 is the obverse side of the chip part 1. The four side surfaces 7 to 10 surround the first main surface 5 when observed in a plan view and along a normal direction n of the first main surface 5 (to be referred to as the plan view). The four side surfaces 7 to 10 may also include a pair of a first side surface 7 and a second side surface 8 opposite to each other in the first direction X, and a pair of a third side surface 9 and a fourth side surface 10 opposite to each other in the second direction Y. In other words, the side surfaces extending in parallel to each other along the second direction Y may be the first side surface 7 and the second side surface 8 on the lateral side of the substrate 2, and the side surfaces extending in parallel to each other along the first direction X may be the third side surface 9 and the fourth side surface 10 on the lengthwise side of the substrate 2. The first side surface 7, the second side surface 8, the third side surface 9 and the fourth side surface 10 may also be referred to as a first end surface, a second end surface, a third end surface and a fourth end surface, respectively.

The first external electrode 3 is formed to cover substantially an entirety of the first main surface 5. The first external electrode 3 has side surfaces 11 to 14 spaced inward from the side surfaces 7 to 10. The four side surfaces 11 to 14 may be a pair of a first side surface 11 and a second side surface 12 opposite to each other in the first direction X and parallel to the pair of the first side surface 7 and the second side surface 8, and a pair of a third side surface 13 and a fourth side surface 14 opposite to each other in the second direction Y and parallel to the pair of the third side surface 9 and the fourth side surface 10. A region between the side surfaces 11 to 14 of the first external electrode 3 and the side surfaces 7 to 10 of the substrate 2 may be an insulative space 15 that exposes an insulative portion on the first main surface 5 of the substrate 2. The side surfaces 11 to 14 of the first external electrode 3 may also be alternatively referred to as an end edges or end surfaces of the first external electrode 3.

A notch 16 is formed on a peripheral edge of the first external electrode 3. The notch 16 may also function as a label for determining the direction of the chip part 1 when the chip part 1 is mounted on the substrate, for example. For example, by visually identifying the position of the notch 16, the orientations of the lengthwise direction (the first direction X) and the widthwise direction (the second direction Y) of the chip part 1 can be identified from outside the chip part 1. In this embodiment, the notch 16 is formed by selectively removing a corner of the substrate 2 opposite to a corner of the first external electrode 3. Alternatively, a total of two notches 16 may be formed individually on a pair of corners corresponding to the side of the first side surface 7 of the substrate 2 in the first direction X. However, from the perspective of an indicator for the direction of the chip part 1, the notch is preferably formed corresponding to one corner, as shown in FIG. 1 and FIG. 2. Thus, the chip part 1 having a rectangular shape in the plan view can be asymmetric in either of the aspects of line symmetry (for example, line symmetry about a line along the first direction X and the second direction Y as the axis of symmetry) and dot symmetry.

The second external electrode 4 is disposed on the second main surface 6. The second external electrode 4 is formed to cover an entirety of the second main surface 6. The second external electrode 4 has a shape consistent with that of the second main surface 6, and has side surfaces 17 to 20 consistent with the side surfaces 7 to 10 of the substrate 2. The four side surfaces 17 to 20 may be a pair of a first side surface 17 and a second side surface 18 opposite to each other in the first direction X and consistent with the pair of the first side surface 7 and the second side surface 8, and a pair of a third side surface 19 and a fourth side surface 20 opposite to each other in the second direction Y and consistent with the pair of the third side surface 9 and the fourth side surface 10. The second external electrode 4 is in direct contact with the substrate 2, and is electrically and mechanically connected at the substrate 2. The first external electrode 3 and the second external electrode 4 are selectively disposed on the first main surface 5 and the second main surface 6 of the substrate 2, respectively. Thus, in this embodiment, the side surfaces 7 to 10 of the substrate 2 may be exposed surfaces not covered by electrode films of the first external electrodes 3 and the second external electrode 4 and hence exposed from the semiconductor surface of the substrate 2.

[Structure of Capacitor Portion 21]

Figure 4:
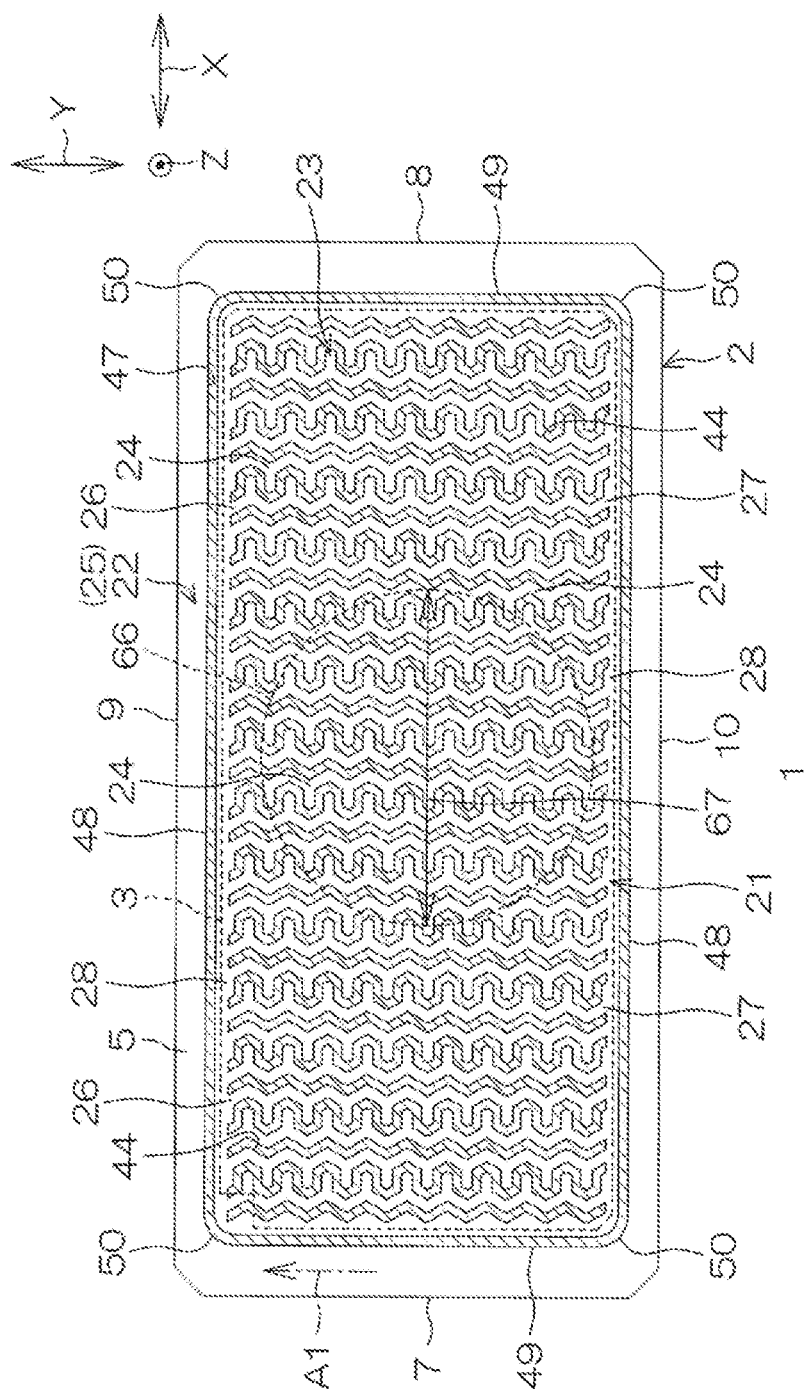
FIG. 4 is a schematic top view of the chip part.
Figure 5:
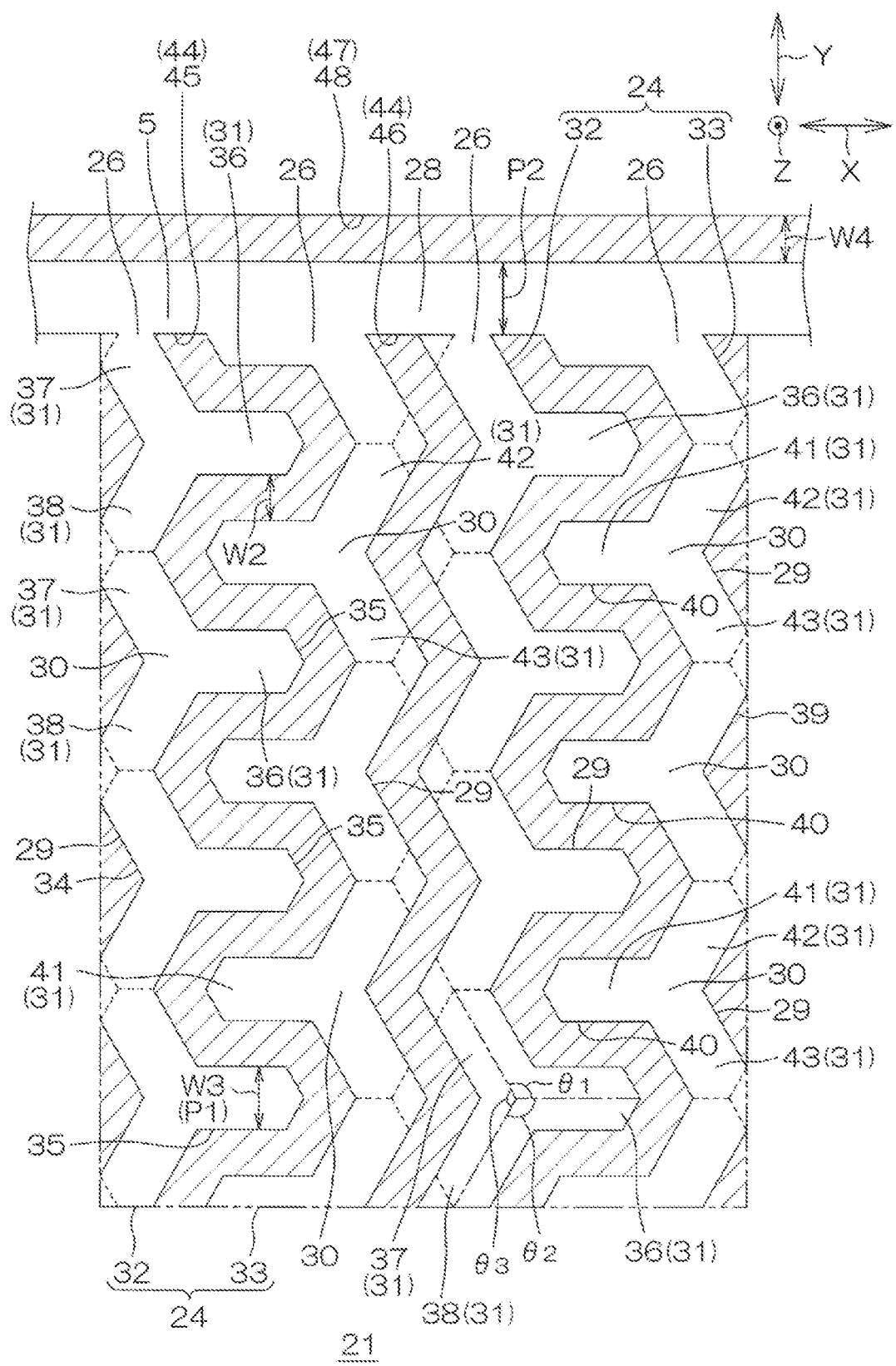
FIG. 5 is an enlarged diagram of a main part of the chip part.
Figure 6:
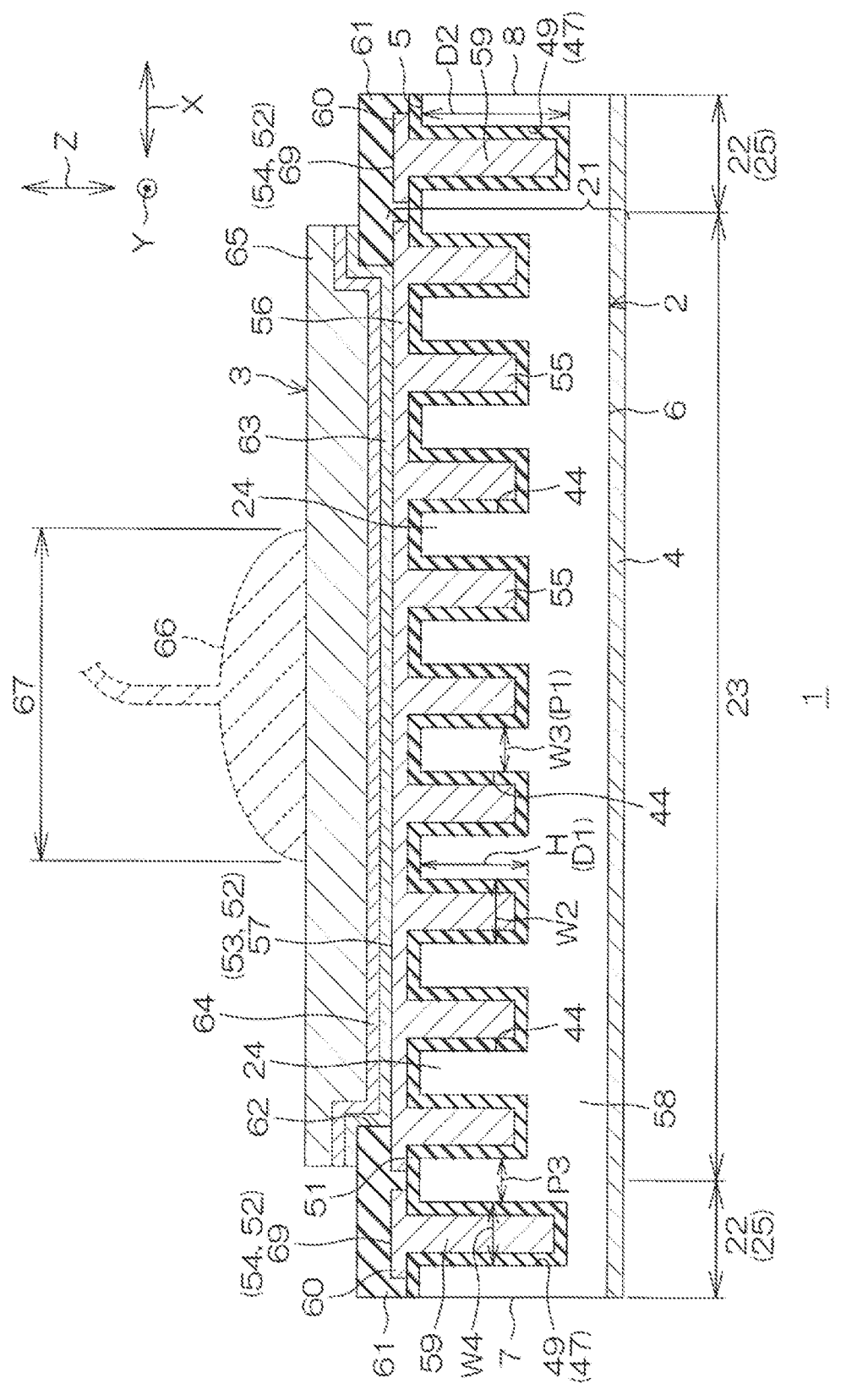
FIG. 6 is a schematic section diagram of the chip part.

FIG. 4 shows a schematic top view of the chip part 1. FIG. 5 shows an enlarged diagram of a main part of the chip part 1 in FIG. 4. FIG. 6 shows a schematic section diagram of the chip part 1. For clarity, in FIG. 4 and FIG. 5, trenches 44 and 47 are shaded by lines. Moreover, in FIG. 4, the first external electrode 3 is depicted perspectively by dotted lines, and a bonding area 67 for a bonding wire is depicted by dotted lines. Moreover, in FIG. 4, the required constituting elements and the reference symbols and numerals are extracted and shown. Moreover, FIG. 6 shows a schematic diagram of the laminated structure on the first main surface 5 of the chip part 1, but is not a cross section along any specific section line in FIG. 4.

First of all, referring to FIG. 4, the chip part 1 is a capacitor element having a capacitor portion 21 formed on the substrate 2. The capacitor portion 21 is formed at a central portion 23 of the substrate 2 spaced from the side surfaces 7 to 10 of the substrate 2 by an annular shape peripheral edge 22 along the side surfaces 7 to 10. The peripheral edge 22 may be an inward region with a fixed range from the side surfaces 7 to 10 of the substrate 2. For example, the width of the peripheral edge 22 may be, for example, between 10 μm and 30 μm.

In the capacitor portion 21, by selectively removing a portion on the side of the first main surface 5 of the substrate 2, a plurality of wall portions 24 are formed using a portion of the substrate 2. The plurality of wall portions 24 have a lengthwise direction, and form strip shapes in the plan view. The plurality of wall portions 24 are formed across an entirety of the capacitor portion 21. Accordingly, in the plan view, the plurality of wall portions 24 overlap the first external electrode 3 and the second external electrode 4. In this embodiment, the wall portions 24 of the capacitor portion 21 have a first lengthwise direction A1. The first lengthwise direction A1 may be a direction parallel to the second direction Y as shown in FIG. 4, or may be a direction parallel to the first direction X. In the capacitor portion 21, the plurality of wall portions 24 are spaced from each other in a direction crossing the first lengthwise direction A1. Accordingly, in the capacitor portion 21, the plurality of wall portions 24 form strip shapes in the plan view.

A portion in the substrate 2 except for the capacitor portion 21 may also be defined as a substrate body portion 25. The substrate body portion 25 surrounds the capacitor portion 21. The substrate body portion 25 may also be consistent with the peripheral edge 22. The substrate body portion 25 is connected to one end 26 and another end portion 27 of each of the wall portions 24 in the first lengthwise direction A1. Accordingly, the wall portions 24 are supported by two sides of the substrate body portion 25. In the substrate body portion 25, a portion near a connection point with the wall portions 24 may also be defined as a support portion 28.

Referring to FIG. 5, the wall portions 24 are formed by a plurality of pillar units 29. Herein, the expression "the wall portions 24 are formed by a plurality of pillar units 29 may refer to, for example, line-shaped wall portions 24 are formed by connecting pillar objects (in this embodiment, the pillar units 29) in the same shape as each other in the plan view. In other words, the wall portions 24 themselves are not pillar-shaped, but as shown by the dotted lines in FIG. 5, the wall portions 24 may be divided by imaginary lines into the pillar units 29 identical to each other. Thus, the base material (in this embodiment, the semiconductor portion) of the substrate 2 is continuous at a border portion between protruding portions 31 of adjacent pillar units 29. Accordingly, the adjacent protruding portions 31 are integrally connected to each other by the base material of the substrate 2.

Each of the plurality of pillar units 29 includes the central portion 30, and three protruding portions 31 extending from the central portion 30 to three different directions in the plan view. The wall portions 24 are formed by connecting the protruding portions 31 of the adjacent pillar units 29. More specifically, angles θ1, θ2 and θ3 are formed between each protruding portion 31 and the adjacent protruding portions 31, and each protruding portion 31 crosses the adjacent protruding portions 31 at the central portion 30.

Moreover, in this embodiment, the angles θ1, θ2 and θ3 are equal to each other and are 120°; however, these angles may also be different from each other. For example, alternatively, the angle θ3 between a second protruding portion 37 and a third protruding portion 38 below is 160°, and the angle θ1 between a first protruding portion 36 and the second protruding portion 37 and the angle θ2 between the first protruding portion 36 and the third protruding portion 38 are both 100°.

In addition, in this embodiment, one pair of adjacent wall portions 24 among the plurality of wall portions 24 may also be referred to as a first wall portion 32 and a second wall portion 33.

The first wall portion 32 includes a first main portion 34 extending along the second direction Y and connected to the support portion 28, and a first branch portion 35 extending along the first direction X and arranged in a comb shape along the second direction Y. Each first branch portion 35 is formed by the first protruding portion 36 of the protruding portion 31 of each pillar unit 29 of the first wall portion 32.

On the other hand, each protruding portion 31 of each pillar unit 29 of the first wall portion 32 includes the second protruding portion 37 and the third protruding portion 38 in addition to the first protruding portion 36. The first main portion 34 is formed by connecting the second protruding portion 37 and the third protruding portion 38 of the adjacent pillar units 29. That is to say, in this embodiment, the second protruding portion 37 and the third protruding portion 38 are alternately arranged along the second direction Y, and in overall form the first main portion 34 appearing corrugated (zigzagged) in the plan view.

The protruding portion 31 forming the one end 26 and another end 27 (not shown in FIG. 5) of the first main portion 34 is connected to the support portion 28. More specifically, the base material portion (in this embodiment, the semiconductor portion) of the substrate 2 is continuous at a border portion between the support portion 28 and the first main portion 34. Accordingly, the support portion 28 and the first main portion 34 are integrally connected by the base material portion of the substrate 2.

The second wall portion 33 includes a second main portion 39 extending along the second direction Y and connected to the support portion 28, and a comb-like second branch portion 40 extending toward the first main portion 34 and engaged with the comb-like first branch portion 35. Each second branch portion 40 is formed by a fourth protruding portion 41 of the protruding portion 31 of each pillar unit 29 of the second wall portion 33.

On the other hand, each protruding portion 31 of each pillar unit 29 of the second wall portion 33 includes a fifth protruding portion 42 and a sixth protruding portion 43 in addition to the fourth protruding portion 41. The second main portion 39 is formed by connecting the fifth protruding portion 42 and the sixth protruding portion 43 of the adjacent pillar units 29. That is to say, in this embodiment, the fifth protruding portion 42 and the sixth protruding portion 43 are alternately arranged along the second direction Y, and in overall form the second main portion 39 appearing corrugated (zigzagged) in the plan view.

The protruding portion 31 forming the one end 26 and another end 27 (not shown in FIG. 5) of the second main portion 39 is connected to the support portion 28. More specifically, the base material portion (in this embodiment, the semiconductor portion) of the substrate 2 is continuous at a border portion between the support portion 28 and the second main portion 39. Accordingly, the support portion 28 and the second main portion 39 are integrally connected by the base material portion of the substrate 2.

Further, in this embodiment, one pair of wall portions 24 including the first wall portion 32 and the second wall portion 33 in comb-like engagement are sequentially formed along the first direction X. That is to say, the first wall portions 32 and the second wall portions 33 are alternately arranged along the first direction X. A capacitor trench 44 is formed between the first wall portion 32 and the second wall portion 33. The capacitor trench 44 is a portion obtained after removing the material of the substrate 2, and is a portion surrounded by the wall portion 24 and the support portion 28. A width W4 of the capacitor trench 44 may be, for example, between 2 μm and 8 μm.

In this embodiment, the capacitor trench 44 may also include a first trench 45 and a second trench 46. The first trench 45 may be formed between the first wall portion 32 and the second wall portion 33 in comb-like engagement, and is formed as a curved shape. The second trench 46 may be formed between the first wall portion 32 and the second wall portion 33 which face each other from opposite sides across the comb teeth, and are formed as corrugated (zigzagged).

In addition, in this embodiment, as shown in FIG. 6, a ratio (W3/H) of a width W3 of the protruding portion 31 of the pillar unit 29 to a height H (the depth of the capacitor trench 44) of the wall portion 24 may be between 2/50 and 2/100. The width W3 of the protruding portion 31 may be defined as a width of each protruding portion 31 in a direction orthogonal to an extending direction from the central portion 30, as shown in FIG. 5. More specifically, the width W3 of the protruding portion 31 of the pillar unit 29 may be, for example, between 2 μm and 8 μm. On the other hand, the height H of the wall portion 24 may be, for example, between 50 μm and 400 μm. Moreover, the width W3 is a distance between adjacent capacitor trenches 44, and may be defined as a pitch P1 of the capacitor trenches 44.

In this embodiment, a dummy trench 47 is formed at the substrate body portion 25. Referring to FIG. 5, the dummy trench 47 is formed in a circumferential direction of the capacitor portion 21. More specifically, the dummy trench 47 may be a dummy trench 47 formed in an annular shape surrounding the capacitor portion 21. The dummy trench 47 is formed in only one row and outwardly from the capacitor portion 21. The dummy trench 47 is formed in a quadrilateral annular shape, which integrally includes: a pair of first linear portions 48, facing each other across the capacitor portion 21 and extending along a first direction X. and a pair of second linear portions 49, facing each other across the capacitor portion 21 and extending along a second direction Y. Moreover, corners 50 of the dummy trench 47, which are connection points of the first linear portions 48 and the second linear portions 49, are formed as rounded corners protruding outward with respect to the substrate 2. In the plan view, when an end of the first linear portion 48 and an end of the second linear portion 49 are continuously through a quarter-circle trench, the term "the rounded corner 50" may also be defined as a trench shaped as a quarter-circle. Moreover, in the plan view, the dummy trench 47 may be disposed outside the first external electrode 3 and is not covered by the first external electrode 3.

Referring to FIG. 5, the first linear portions 48 of the dummy trench 47 may also be separated from the capacitor trenches 44 in the second direction Y by a pitch P2, which has a size between 90% and 110% of the pitch P1 of the capacitor trenches 44. In this embodiment, the pitch P2 has a size same as a size of the pitch P1. Moreover, the dummy trench 47 may also have a width W4 equal to a width W2 of the capacitor trenches 44. In FIG. 5, the width W4 of the first linear portions 48 is depicted, the dummy trench 47 is formed throughout the full periphery by a fixed width, and the second linear portions 49 also have the same width W4 as the first linear portions 48.

Referring to FIG. 6, the second linear portions 49 of the dummy trench 47 may be separated from the capacitor trenches 44 in the first direction X by a pitch P3, which has a size between 90% and 110% of the pitch P1 of the capacitor trenches 44. In this embodiment, the pitch P2 has a size same as a size of the pitch P1. Moreover, the dummy trench 47 has a depth D2 larger than a depth D1 of the capacitor trenches 44. For example, the depth of the dummy trench 47 may be between D1×1.1 μm and D1×1.3 μm.

Referring to FIG. 6, on the first main surface 5 of the substrate 2, a capacitive film 51 is formed to cover the entirety of the first main surface 5 of the substrate 2. In addition to being formed on the first main surface 5 that is a flat surface of the substrate 2, the capacitive film 51 is also formed on entire inner surfaces of the capacitor trenches 44 and the dummy trench 47. The capacitive film 51 has an end surface consistent with the side surfaces 7 to 10 of the substrate 2. The capacitive film 51 may be a $SiO_2$ film, a silicon nitride (SiN) film, or a laminated film of the above. For example, the capacitive film 214 may also be a $SiO_2$/SiN laminated film, or a $SiO_2$/SiN/$SiO_2$ laminated film. Moreover, the capacitive film 51 may also be an oxide-nitride (ON) film, or an oxide-nitride-oxide (ONO) film, or may be a laminated film of the above. Further, the capacitive film 51 may also be an insulating film including a high dielectric material (high-k material). A high dielectric material, in addition to aluminum oxide ($Al_2O_3$), tantalum pentoxide ($Ta_2O_5$), titanium pentoxide ($Ti_3O_5$) and hafnium oxide ($HfO_2$), the high dielectric material may further include, for example, perovskite compounds such as strontium titanate ($SrTiO_3$) and barium strontium titanate ($Ba_xSr_{1-x}$) $TiO_3$. In this embodiment, the capacitive film 51 is formed by a $SiO_2$ film.

Refer to FIG. 6, an embedded conductor 52 is disposed on the capacitive film 51. In this embodiment, the embedded conductor 52 integrally includes a first embedded conductor 53 disposed at the capacitor portion 21, and a second embedded conductor 54 disposed at the peripheral edge 22 of the substrate 2.

The first embedded conductor 53 is embedded into the capacitor trenches 44, and is formed along the first main surface 5 of the substrate 2. The first embedded conductor 53 is integrally embedded into an embedding portion 55 in the capacitor trench 44, and a flat portion 56 connected to an upper end of the embedding portion 55 and formed flat along the first surface 5 of the substrate 2. The flat portion 56 is formed to be drawn out to a peripheral edge of the first embedded conductor 53 outside the capacitor portion 21.

Moreover, the first embedded conductor 53 may be made of, for example, a semiconductor material such as polysilicon, or a metal material including Cu or Al. If the first embedded conductor is made of a metal material, for example. Cu, Al, AlSi or AlCu may be included. Moreover, the thickness of the first embedded conductor 53 (the flat portion 56) may be between 4000 Å and 10000 Å A (between 400 nm and 1000 nm).

In the chip part 1, the first embedded conductor 53 forms an upper electrode 57 in the capacitor portion 21. On the other hand, the substrate 2 made of a semiconductor substrate containing impurities forms a lower electrode 58 in the capacitor portion 21. That is to say, in the chip part 1, with the capacitive film 51 and the upper electrode 57 and the lower electrode 58 (the substrate 2) separated by the capacitive film 51, the vertical capacitor portion 21 having a laminated structure including the upper electrode 57-capacitive film 51-lower electrode 58 is formed in the lengthwise direction along the thickness direction of the substrate 2.

The second embedded conductor 54 is embedded into the dummy trench 47, and is formed along the first main surface 5 of the substrate 2. The second embedded conductor 54 is integrally includes an embedding portion 59 embedded in the dummy trench 47, and a flat portion 60 connected to an upper end of the embedding portion 59 and formed flat along the first surface 5 of the substrate 2. Moreover, the second embedded conductor 54 may be made of, for example, a semiconductor material such as poly silicon, or a metal material including Cu or Al. In this embodiment, the second embedded conductor 54 is formed of a material same with that of the first embedded conductor 53. If the second embedded conductor is made of a metal material, for example, Cu, Al, AlSi or AlCu may be included. Moreover, the thickness of the second embedded conductor 54 (the flat portion 60) may be between 4000 Å and 10000 Å (between 400 nm and 100 nm).

In the chip part 1, the second embedded conductor 54 is physically separated from the first embedded conductor 53, and does not form an electrode of the capacitor portion 21. Thus, the second embedded conductor 54 may also be referred to as a dummy electrode 69 of the chip part 1.

Referring to FIG. 6, a surface insulating film 61 is disposed on the substrate 2. The surface insulating film 61 covers the first embedded conductor 53 (the upper electrode 57) and the second embedded conductor 54. The surface insulating film 61 may be, for example, a SiO$_2$ film or a SiN film. The thickness of the surface insulating layer 61 may be, for example, between 10000 Å and 15000 Å (between 1 µm and 1.5 µm). A contact hole 62 that exposes a portion of the upper electrode 57 is formed on the surface insulating film 61. On the other hand, the second embedded conductor 54 is completely covered by the surface insulating film 61.

Referring to FIG. 5, the first external electrode 3 is disposed on the surface insulating film 61. The first external electrode 3 is electrically connected to the upper electrode 57 in the contact hole 62. The first external electrode 3 may also include a laminated film including a plurality of conductive layers. For example, the second external electrode 3 may also include a first layer 63, a second layer 64 and a third layer 65 sequentially laminated from the substrate 2. The first layer 63 also be referred to as, for example, a barrier layer including Ti. The second layer 64 also be referred to as, for example, a spluttering layer including Au. The third layer 65 also be referred to as, for example, a coating layer including Au. When the second layer 64 and the third layer 65 are formed by the same material, there may be no boundary between the two. The third layer 65 may be thicker than the first layer 63 and the second layer 64.

Referring to FIG. 6, the second external electrode 4 is connected to the second main surface 6 of the substrate 2. The second external electrode 4 is electrically connected to the lower electrode 58. The second external electrode 4 may also be, for example, a Ni/PdAu laminated film sequentially including an Ni film, a Pd film and an Au film from the substrate 2.

In this embodiment, the first external electrode 3 and the second external electrode 4 form two terminals of the vertical chip part 1. The vertical chip part 1 can be, for example, bonded on the substrate via the second external electrode 4, and bonded to the first external electrode 3 by a bonding member such as a bonding wire 66 for further use. As shown in FIG. 4 and FIG. 6, the bonding wire 66 is formed directly above the capacitor portion 21. In other words, in the plan view, the capacitor portion 21 may also be covered by the bonding area 67 used for the bonding wire 66 (referring to FIG. 4), or the capacitor portion 21 may also face the bonding area 67 in the thickness direction (the third direction Z) of the substrate 2 (referring to FIG. 6). According to the configuration, the capacitor portion 21 is also disposed in a region directly below bonding area 67 used for the bonding wire 66. Thus, the capacitance value of the capacitor portion 21 can be increased. The first external electrode 3 and the second external electrode 4 may also be referred to as a first terminal electrode and a second terminal electrode or be referred to as a first external terminal and a second external terminal.

According to the chip part 1, the upper electrode 57 and the lower electrode 58 (the substrate 2) face each other across the capacitive film 51. Thus, the vertical capacitor portion 21 having a laminated structure including the upper electrode 57-capacitive film 51-lower electrode 58 is formed in the lengthwise direction along the thickness direction of the substrate 2. With the vertical capacitor portion 21, the first external electrode 3 used for the upper electrode 57 can be disposed on the first main surface 5 and the second external electrode 4 used for the lower electrode 58 can be disposed on the second main surface 6. Hence, it is not necessary to arrange these external electrodes 3 and 4 along the lateral direction of the first main surface 5 of the substrate 2. Therefore, the lateral space of the substrate can be efficiently utilized, thereby providing the small-size chip part.

Moreover, the wall portions disposed at the substrate are formed by the plurality of pillar units. Each of the plurality of pillar units 29 includes the central portion 30, and three protruding portions 31 extending from the central portion 30 to three different directions in the plan view. Accordingly, compared to when the wall portions 24 are formed by connecting pillars such as quadrilateral pillars 29, the surface area of the wall portions 24 can be increased. Moreover, the capacitor portion 21 is formed by imitating the surfaces of the wall portions 24. Thus, the capacitance of the capacitor portion 21 is not limited by the plane size of the substrate 2, and a large capacitance can be realized by increasing the height of the wall portions 24. That is to say, even if the plane size of the substrate 2 is smaller, it is ensured that the capacitor portion 21 has a larger capacitance.

In addition, if the wall portions 24 are formed by connecting the plurality of pillar units 29, the stability achieved is better than that achieved by pillar units 29 separated from each other. Further, as shown in FIG. 4, at least one of the one end 26 and another end 27 of each wall portion 24 is connected to the substrate body portion 25 around the wall portion 24. Thus, the wall portions 24 can be cantilevered at least from the side and therefore can be reinforced to withstand lateral forces applied to the wall portions 24. As a result, even if the height of the wall portions 24 is increased, the stability of the wall portions 24 can still be maintained, thereby enhancing component reliability.

[Manufacturing Method of Chip Part 1]

FIG. 7A to FIG. 7G show diagrams of manufacturing steps of the chip part 1 in sequence, and correspond to the cross section in FIG. 6.

Figure 7A:
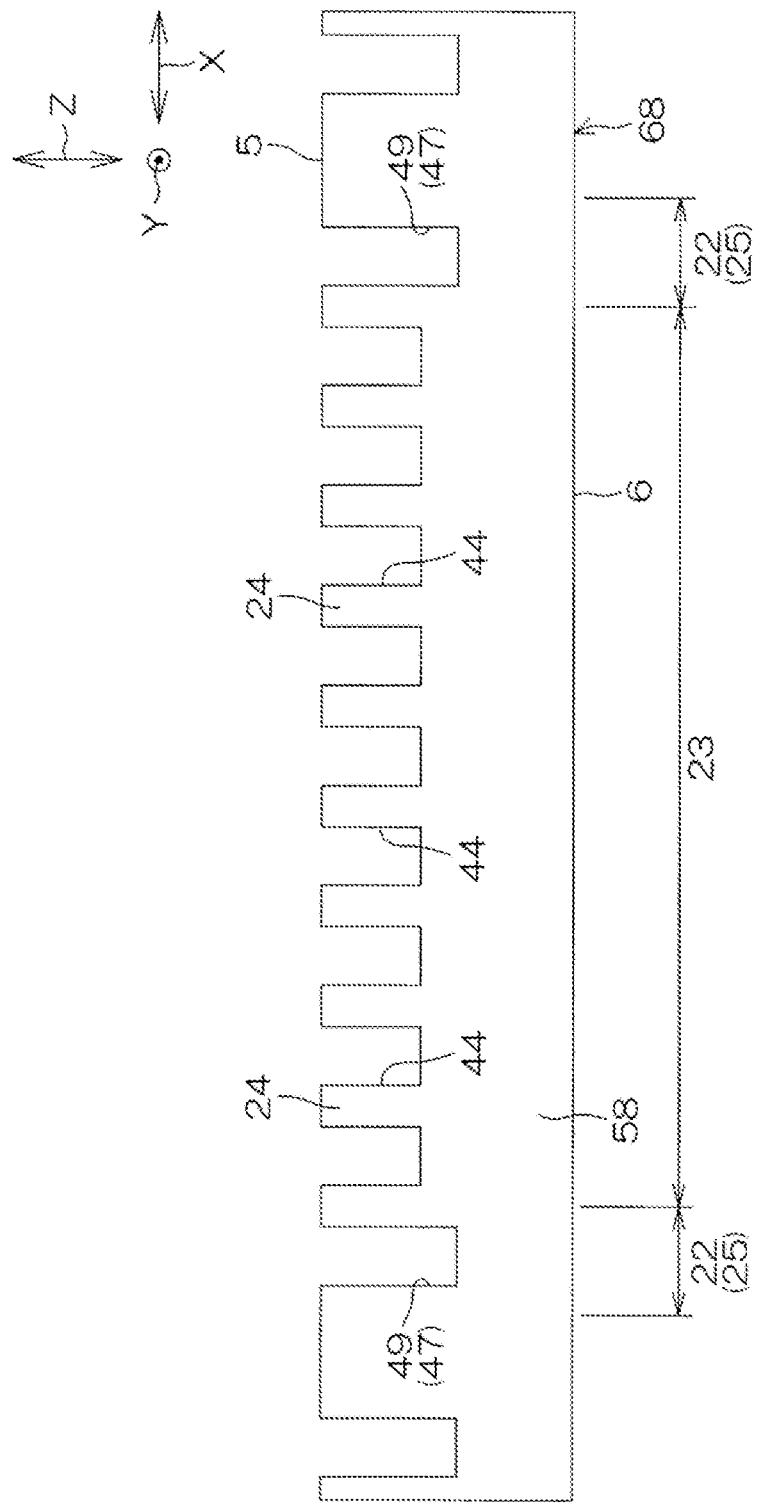
FIG. 7A is a schematic section diagram of a part of a manufacturing step of the chip part.

To manufacture the chip part 1, first of all, referring to FIG. 7A, a wafer 68 to become a base of the substrate 2 is prepared. Then, for example, a hard mask (not shown) containing $SiO_2$ is formed by thermally oxidizing the first main surface 5 of the wafer 68. Next, an opening is formed at the hard mask, and etching is selectively performed on wafer 68 by using the hard mask from the side of the first main surface 5. Herein, the capacitor trenches 44 and the dummy trench 47 are formed at portions removed from the wafer 68, and the wall portions 24 and the substrate body portion 25 are formed on portions other than the capacitor trenches 44 and the dummy trench 47. Dry etching is preferably used as a means of etching.

At this point, the dummy trench 47 is formed around the capacitor portion 21. Thus, when the capacitor trenches 44 and the first dummy trench 47 are formed by etching the wafer 68, compared to a forming region of the capacitor trenches 44 on the inside, more etching gas is supplied to a forming region of the first dummy trench 47 on the outside. In other words, etching gas is exists in a large amount at the peripheral edge 22 of the forming region of the chip parts 1, and so the amount of etching gas supplied to the forming region of the dummy trench 47 is increased and the dummy trench 47 is formed at a higher etch rate than that of the capacitor trenches 44. Therefore, the dummy trench 47 are formed to be deeper than the capacitor trenches 44. On the other hand, for the forming region of the capacitor trenches 44, etching gas is uniformly supplied along an inward direction of the first main surface 5 of the semiconductor substrate 2. As a result, deviation in depths of the capacitor trenches 44 forming the capacitor portion 21 can be inhibited to thereby inhibit deviation between the capacitance values near the peripheral edge 22 and a central portion of the capacitor portion 21.

Figure 7B:
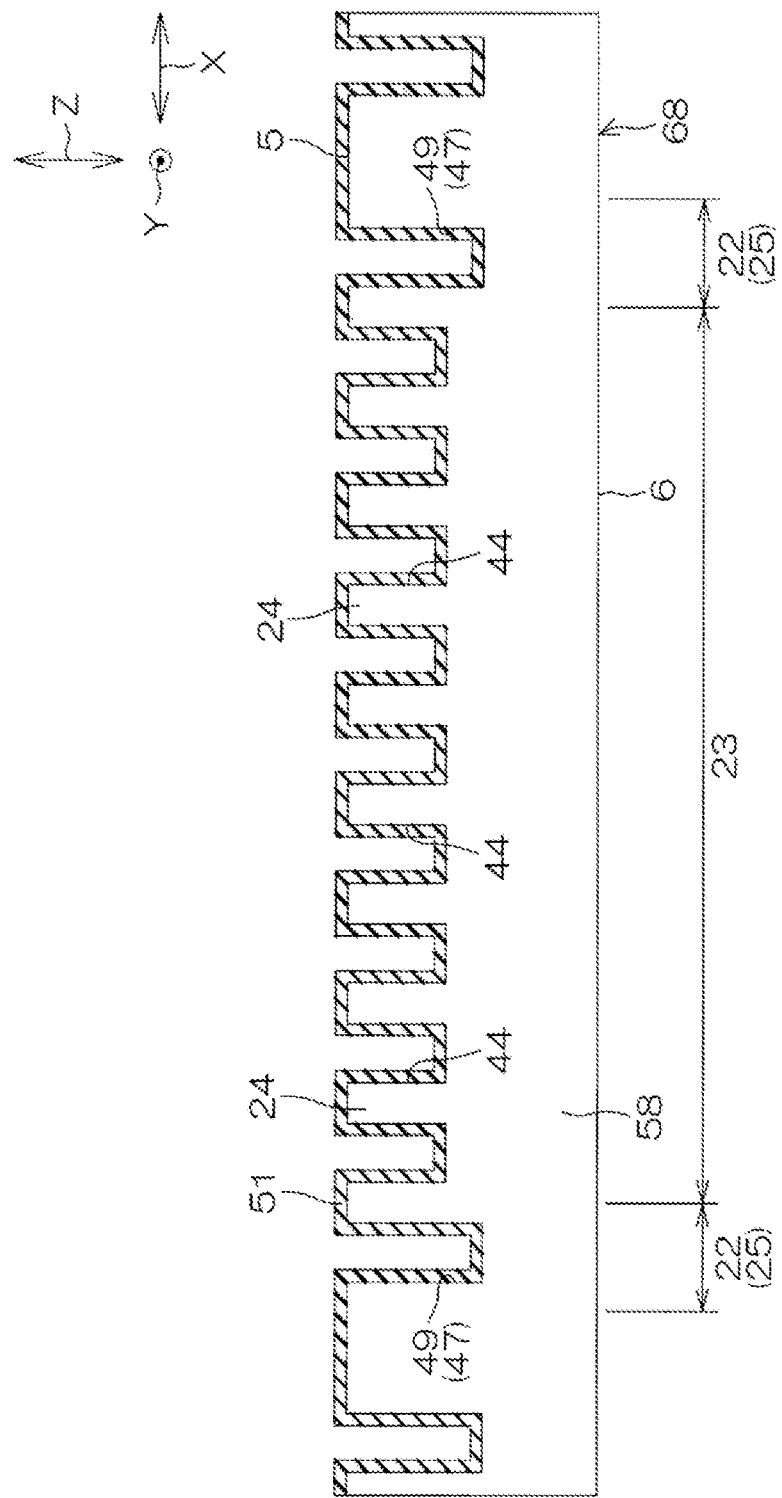
FIG. 7B is a diagram of a next step of FIG. 7A.

Next, referring to FIG. 7B, the capacitive film 51 is formed on the first main surface 5 of the wafer 68, inner surfaces of the capacitor trenches 44 and an inner surface of the dummy trench 47. The capacitive film 51 may be formed by means of, for example, thermal oxidation or chemical vapor deposition (CVD), or a combination of the above.

Figure 7C:
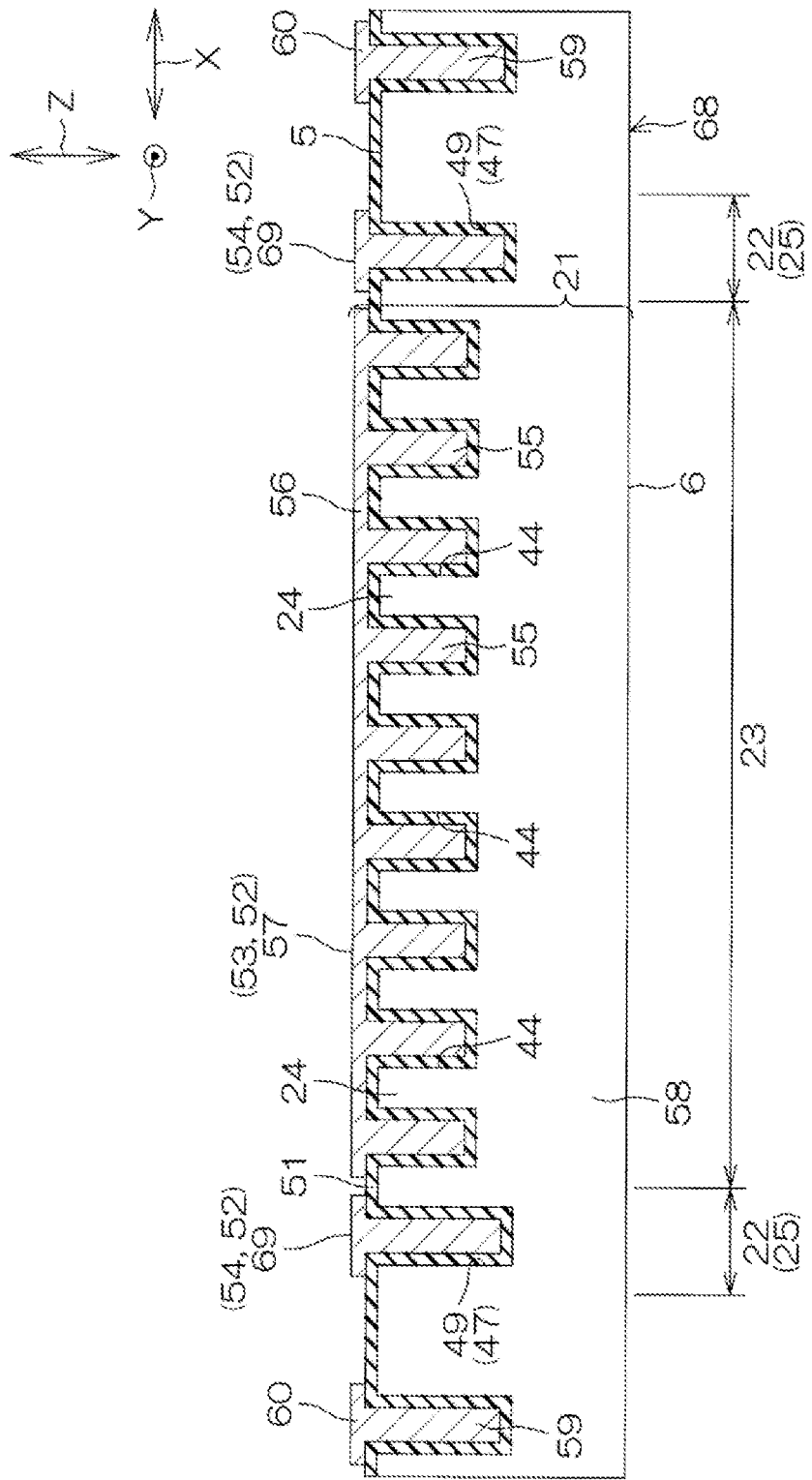
FIG. 7C is a diagram of a next step of FIG. 7B.

Next, referring to FIG. 7C, by means of CVD, for example, a conductive film (not shown) that becomes a base of the embedded conductor 52 is formed on the capacitive film 51. The conductive film is embedded into the capacitor trenches 44 and the dummy trench 47, and is formed to cover the entire surface of the first main surface 5 of the wafer 68. Then, the conductive film is patterned to form the first embedded conductor 53 (the upper electrode 57) and the second embedded conductor 54 (the dummy electrode 69). Thus, the capacitor portion 21 including the lower electrode 58 (the wafer 68), the capacitive fib and the upper electrode 57 is formed.

Figure 7D:
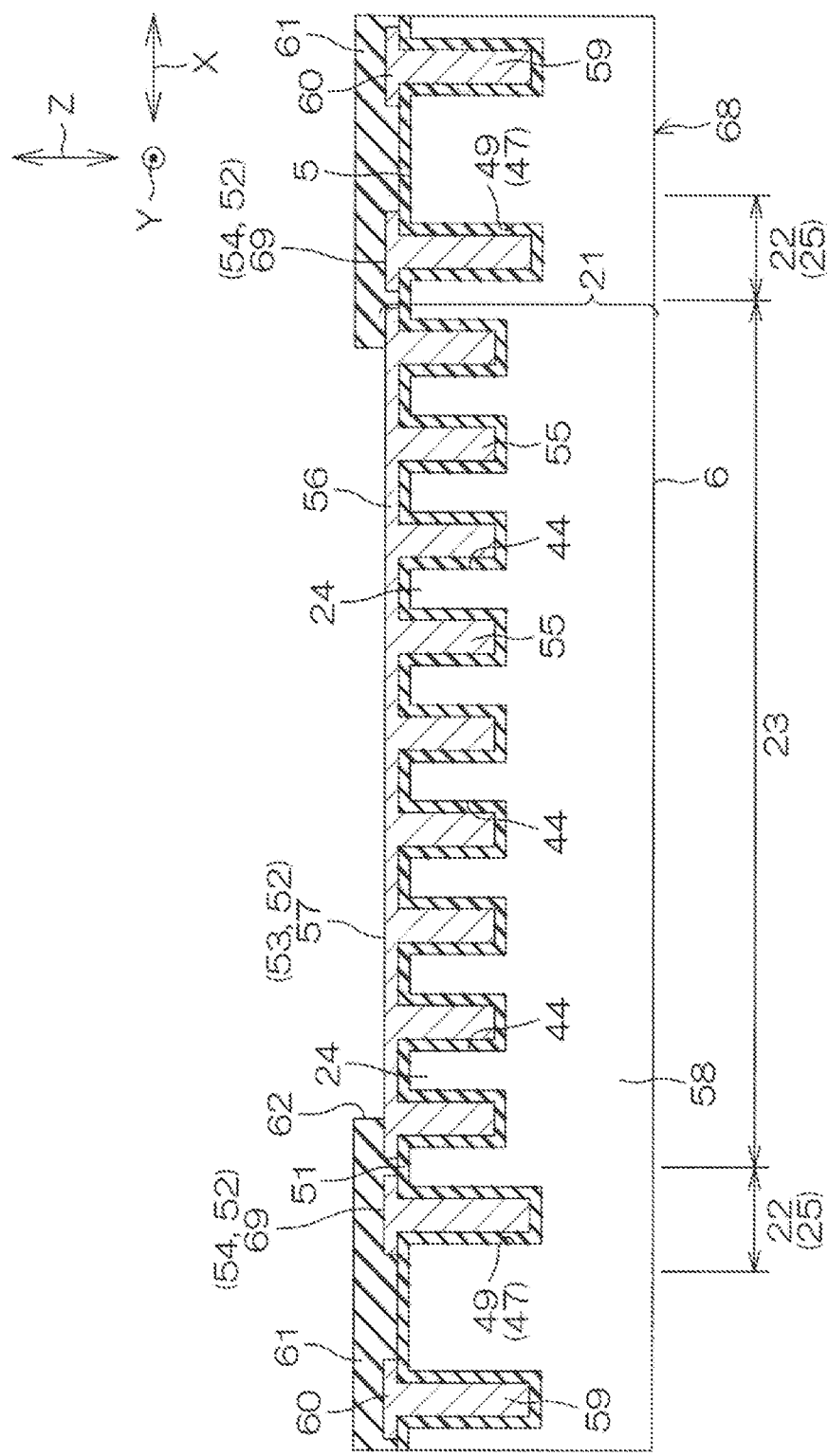
FIG. 7D is a diagram of a next step of FIG. 7C.

Next, referring to FIG. 7D, by means of CVD, for example, the surface insulating film 61 is formed. Then, the surface insulating film 61 is patterned to form the contact hole 62.

Figure 7E:
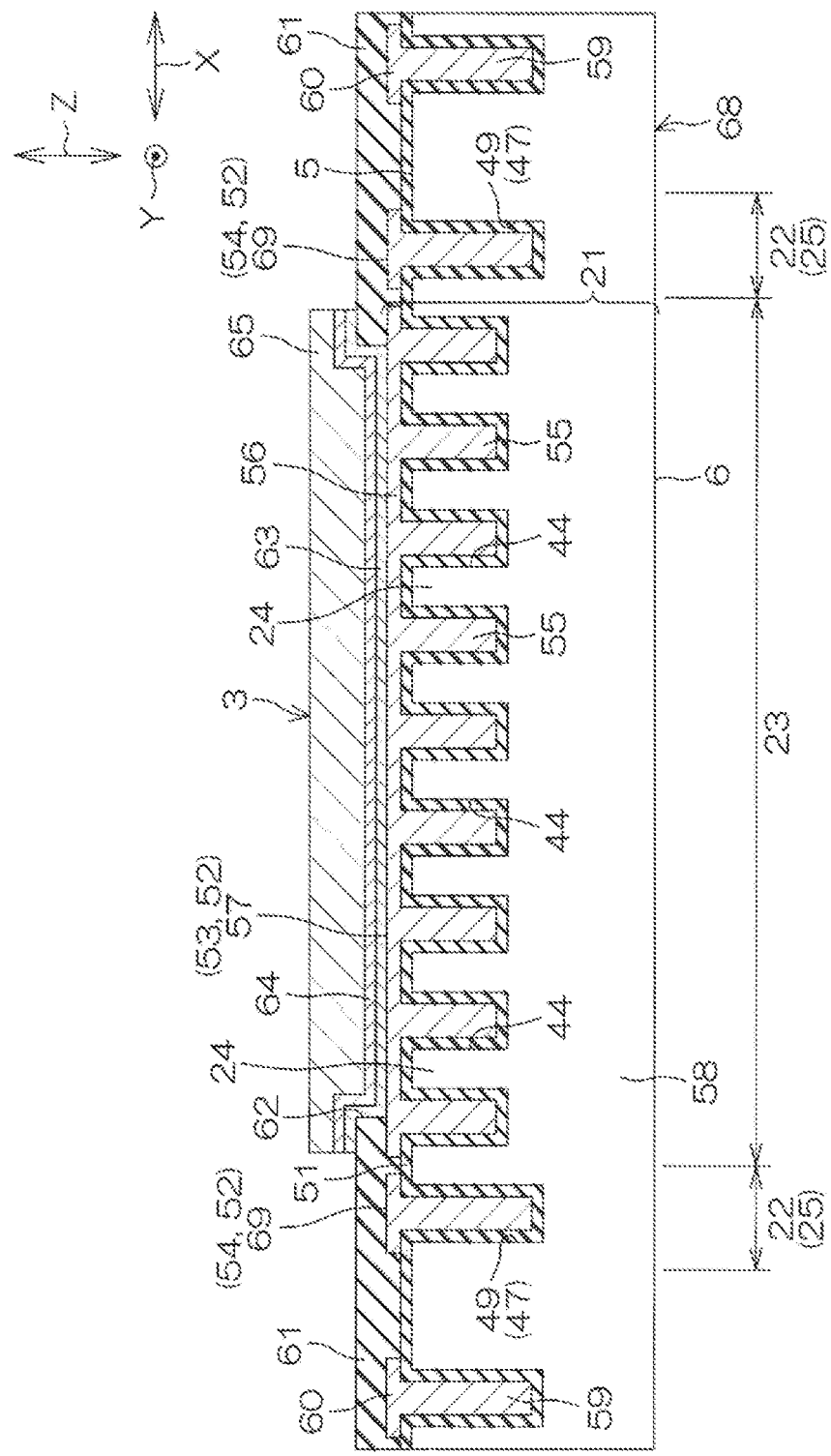
FIG. 7E is a diagram of a next step of FIG. 7D.

Then, referring to FIG. 7E, the first external electrode 3 is formed. For example, after the first layer 63 and the second layer 64 are sequentially formed by sputtering, the third layer 65 is formed by plating deposition from the second layer 64.

Figure 7F:
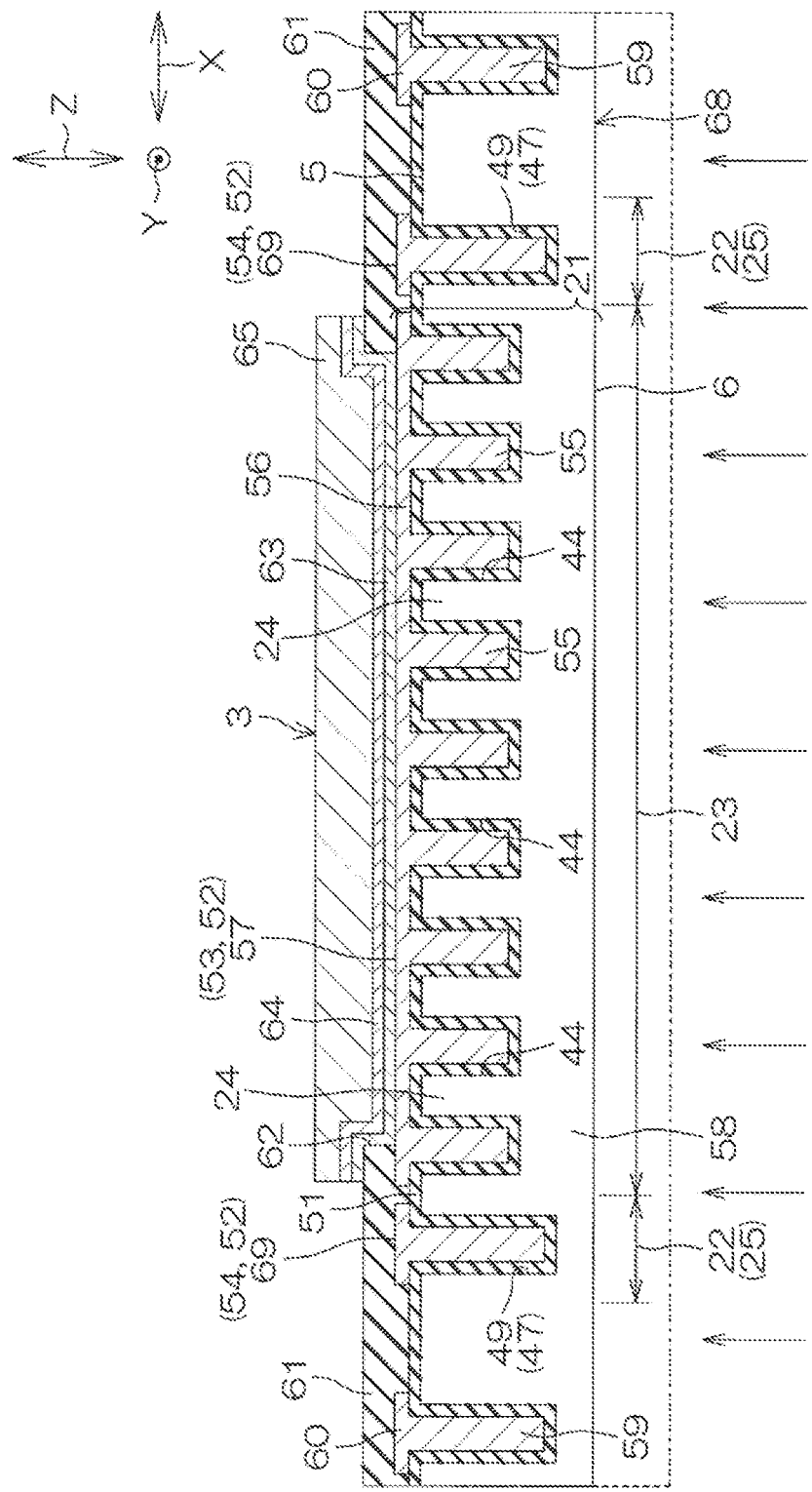
FIG. 7F is a diagram of a next step of FIG. 7E.

Next, referring to FIG. 7F, the wafer 68 is ground from the second main surface 6. Thus, the wafer 68 is thinned.

Figure 7G:
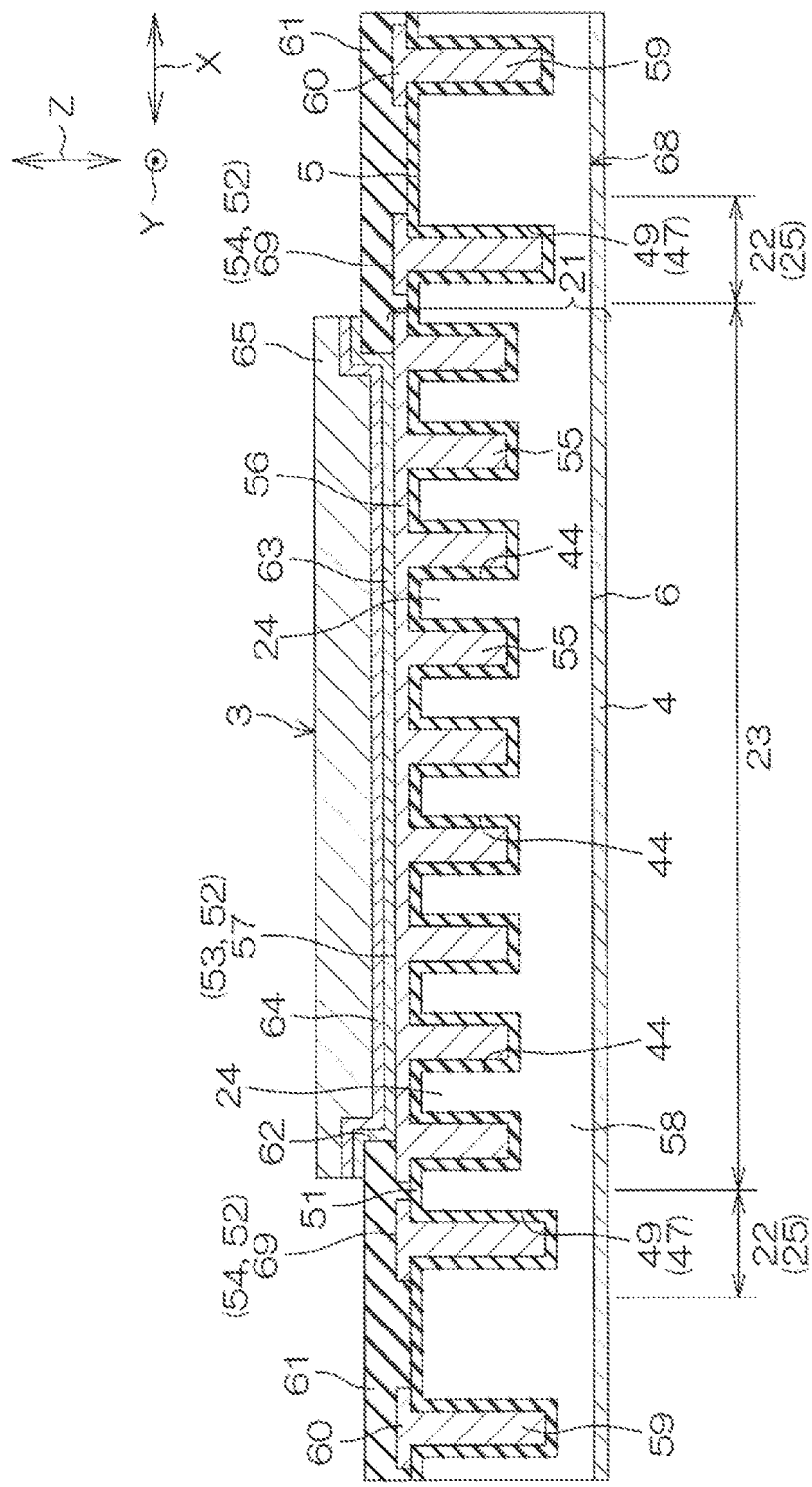
FIG. 7G is a diagram of a next step of FIG. 7F.

Next, referring to FIG. 7G, by means of sputtering, for example, the second external electrode 4 is formed on the second main surface 6 of the wafer 68.

Figure 7H:
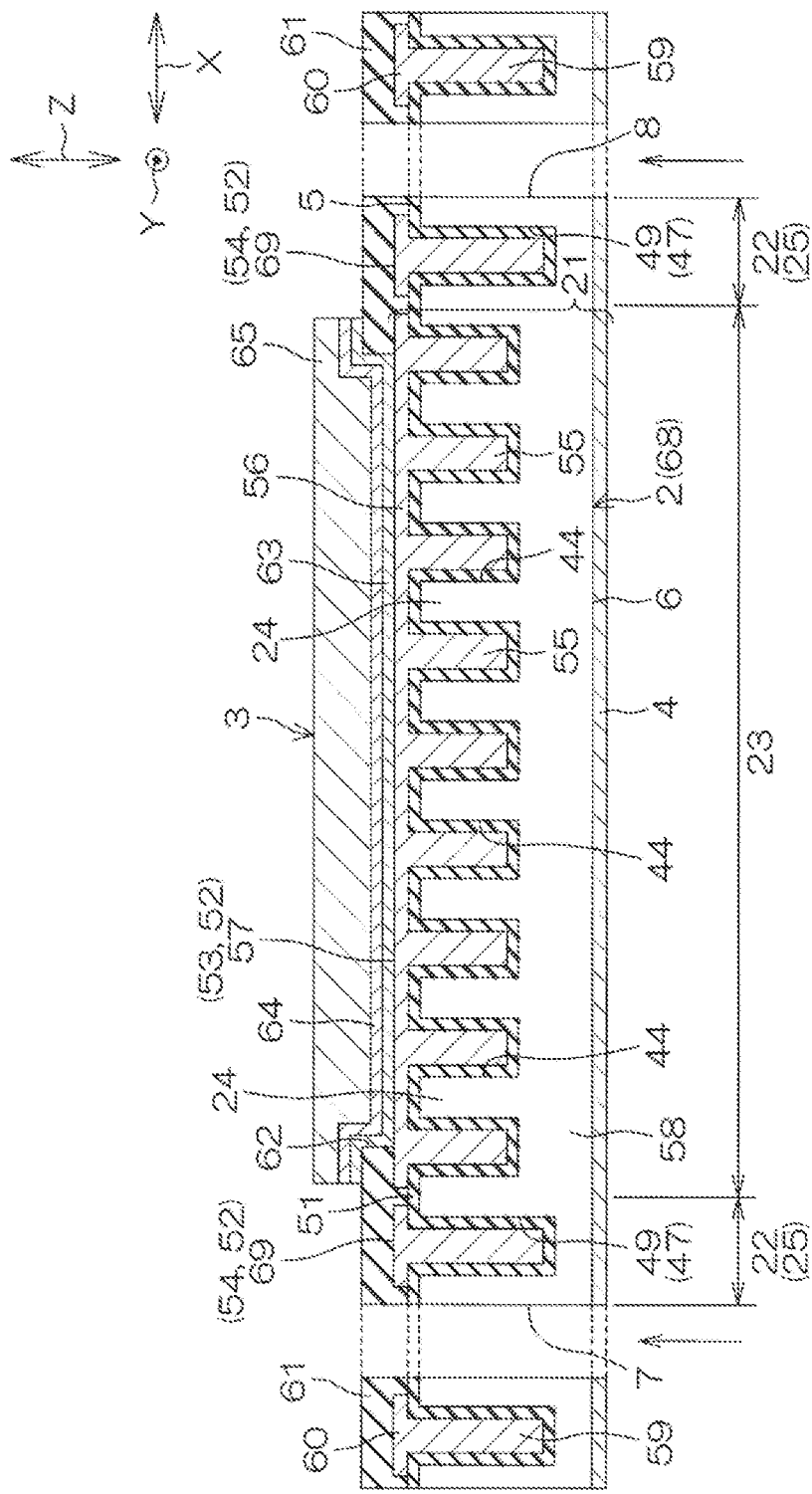
FIG. 7H is a diagram of a next step of FIG. 7G.

Next, referring to FIG. 7H, a cutting blade is inserted on the side of the second main surface 6 of the wafer 68 to cut (disconnect) the wafer 68. Thus, the chip parts 1 are obtained after the cutting.

[Implementation of Chip Part 71 to 78]

Next, structures of the chip parts 71 to 78 are described with reference to FIG. 8 to FIG. 16 below. In FIG. 8 to FIG. 16, structures corresponding to the structures described with reference to FIG. 1 to FIG. 6 are given the same numeral and symbols and the repeated details are omitted below. Moreover, in FIG. 8 to FIG. 16, the constituting elements and the reference symbols and numerals required illustrating the features of the chip parts 71 to 78 are extracted and shown.

[Chip Part 71]

Figure 8:
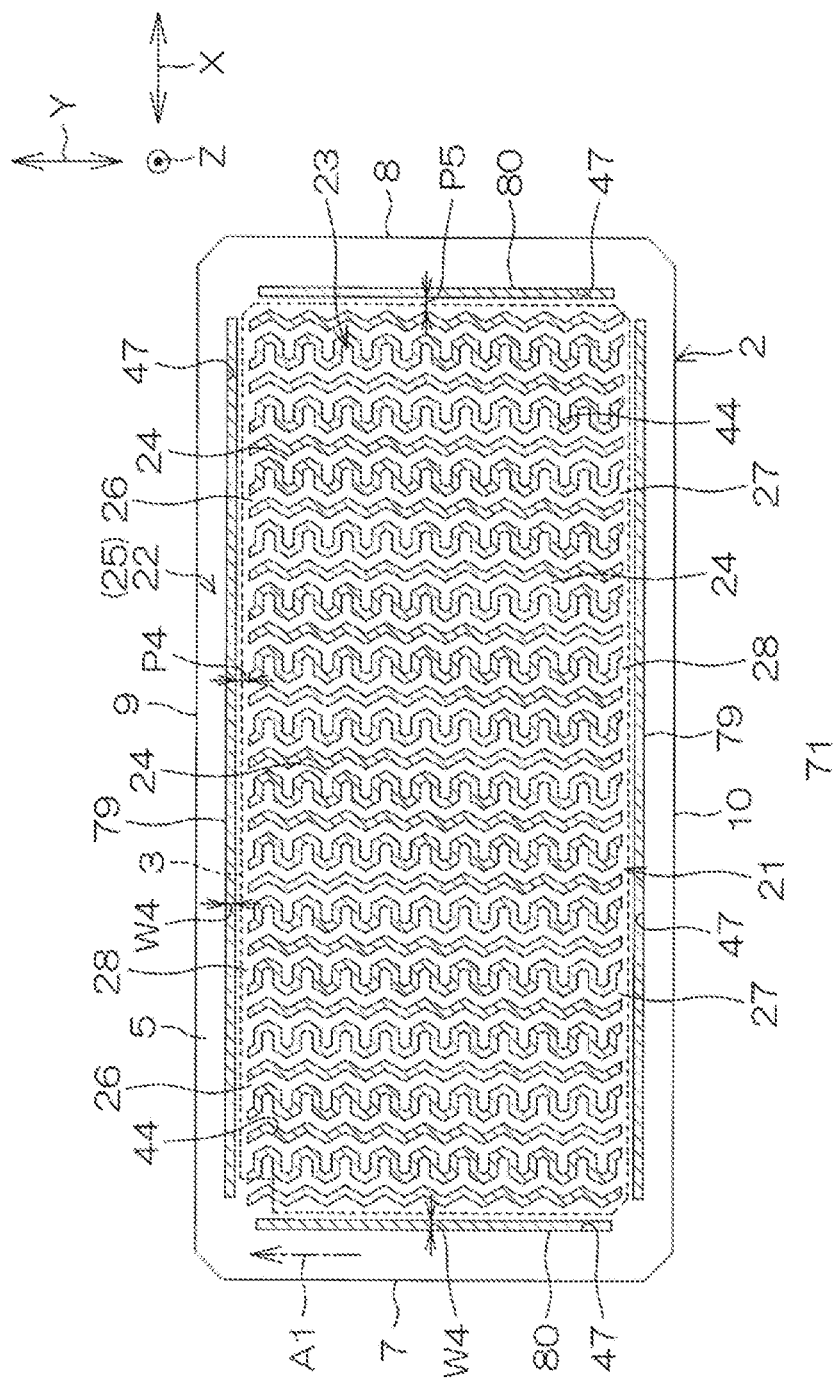
FIG. 8 is a schematic top view of the chip part.

FIG. 8 shows a schematic top view of the chip part 71. In the chip part 71, the dummy trench 47 includes a plurality of physically separated trenches. More specifically, the dummy trench 47 includes a first linear trench 79 and a second linear trench 80 physically separated from each other. The first linear trench 79 includes a pair of first linear trenches 79 facing each other across the capacitor portion 21 in the second direction Y and extending along the first direction X. The second linear trench 80 includes a pair of second linear trenches 80 facing each other across the capacitor portion 21 in the first direction X and extending along the second direction Y. For example, the chip part 71 may also be in a form from which the corners 50 of the dummy trench 47 of the chip part 1 are omitted.

Similar to the first linear portions 48 in FIG. 5, the first linear trenches 79 may also be separated from the capacitor trenches 44 in the second direction Y by a pitch P4, which has a size between 90% and 110% of the pitch P1 of the capacitor trenches 44. In this embodiment, the pitch P4 has a size same as a size of the pitch P1. Similar to the second linear portions 49 in FIG. 6, the second linear trenches 80 may also be separated from the capacitor trenches 44 in the second direction Y by a pitch P5, which has a size between 90% and 110% of the pitch P1 of the capacitor trenches 44. In this embodiment, the pitch P5 has a size same as a size of the pitch P1.

According to the chip art 1, the first linear trenches 79 and the second linear trenches 80 are separated from each other. Thus, it can be ensured that the thickness of the substrate 2 is larger near the four corners of the substrate 2. Therefore, strength reliability of the chip part 71 can be enhanced.

[Chip Part 72]

Figure 9:
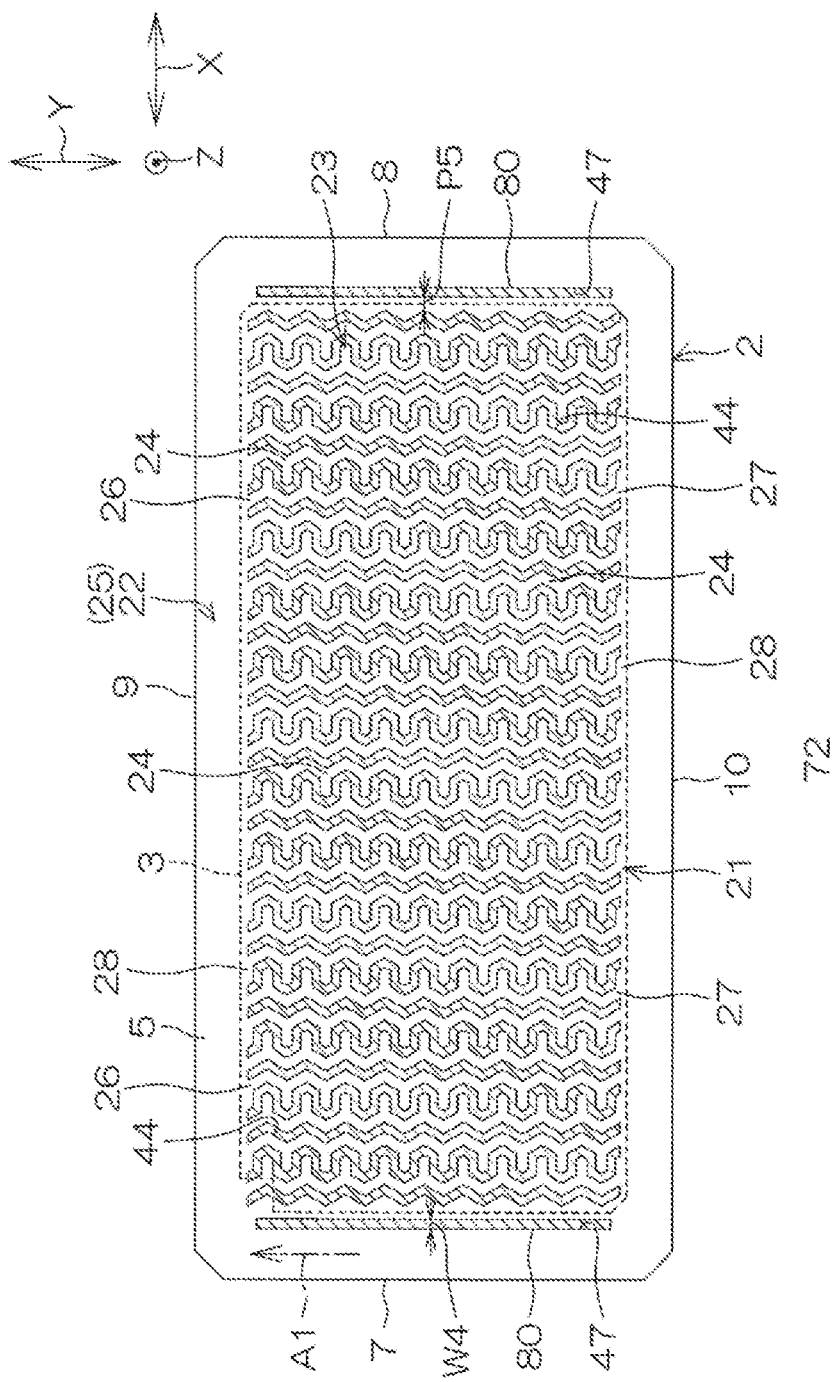
FIG. 9 is a schematic top view of the chip part.

FIG. 9 shows a schematic top view of the chip part 72. In the chip part 72, the first linear trenches 79 are omitted from the chip part 71 in FIG. 8. That is to say, in the chip part 72, the second linear trenches 80 are selectively formed on two outer sides of the capacitor portion 21 in the first direction X.

[Chip Part 73]

Figure 10:
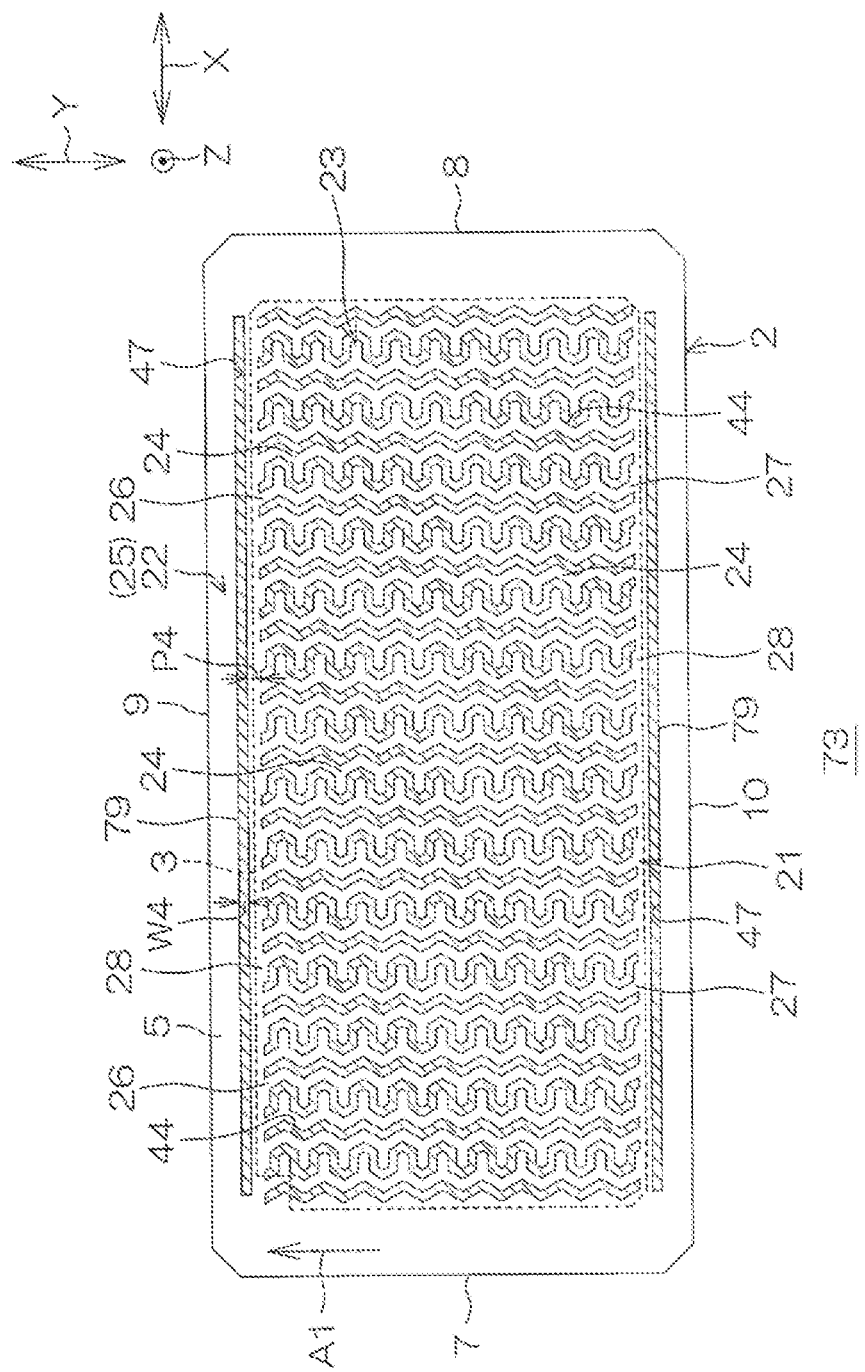
FIG. 10 is a schematic top view of the chip part.

FIG. 10 shows a schematic top view of the chip part 73. In the chip part 73, the second linear trenches 80 are omitted from the chip part 71 in FIG. 8. That is to say, in the chip part 73, the first linear trenches 79 are selectively formed on two outer sides of the capacitor portion 21 in the second direction Y.

[Chip Part 74]

Figure 11:
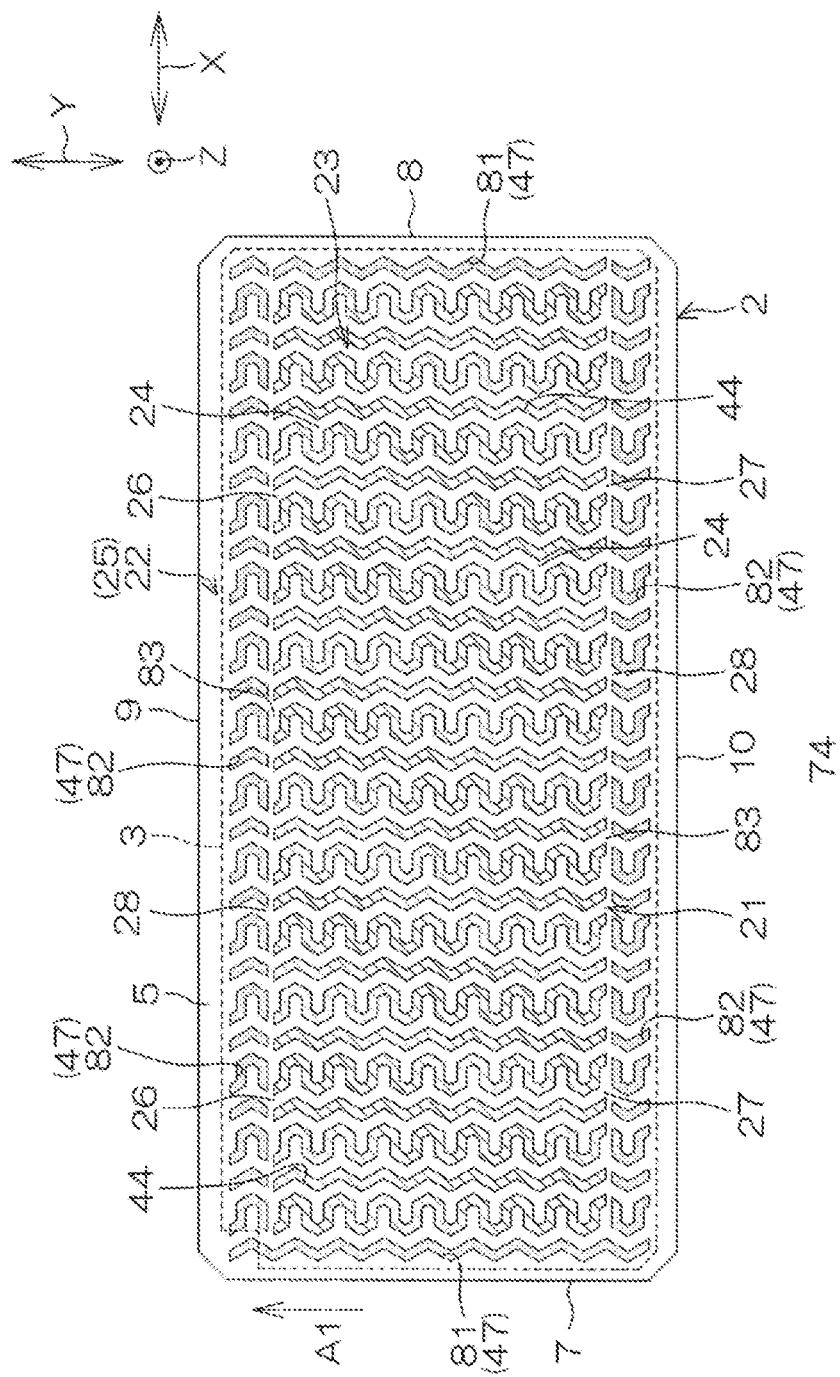
FIG. 11 is a schematic top view of the chip part.

FIG. 11 shows a schematic top view of the chip part 74. In the chip part 74, a portion of the plurality of capacitor trenches 44 is used as the dummy trench 47. For clarity, in FIG. 11, the portion of the capacitor trenches 44 used as the dummy trench 47 is represented by a gray filled area. More specifically, among the plurality of capacitor trenches 44 arranged along the first direction X, the pair of capacitor trenches 44 nearest to the first side surface 7 and the second side surface 8 may also be first dummy trenches 81 that do not contribute to capacitor operations of the capacitor portion 21.

On the other hand, the remaining capacitor trenches 44 apart from the first dummy trenches 81 are divided on two ends in the second direction Y. Portions of the capacitor trenches 44 remaining near the third side surface 9 and the fourth side surface 10 by the dividing may also be second dummy trenches 82 that do not contribute to capacitor operations of the capacitor portion 21. The second dummy trenches 82 are remaining portions obtained by dividing the capacitor trenches 44 in the lateral direction. Thus, one second dummy electrode 82, which is interposed by a border portion 83 that extends across the plurality capacitor trenches 44 along the first direction X, is provided in each of the plurality of capacitor trenches 44. Moreover, the second dummy trenches 82 are formed in a planar (corrugated (zigzagged)) shape having continuity with a planar shape of each of the capacitor trenches 44 along the second direction Y (the first lengthwise direction A1).

In addition, the first dummy trenches 81 and the second dummy trenches 82 may be covered by the first external electrode 3 in the plan view.

[Chip Part 75]

Figure 12:
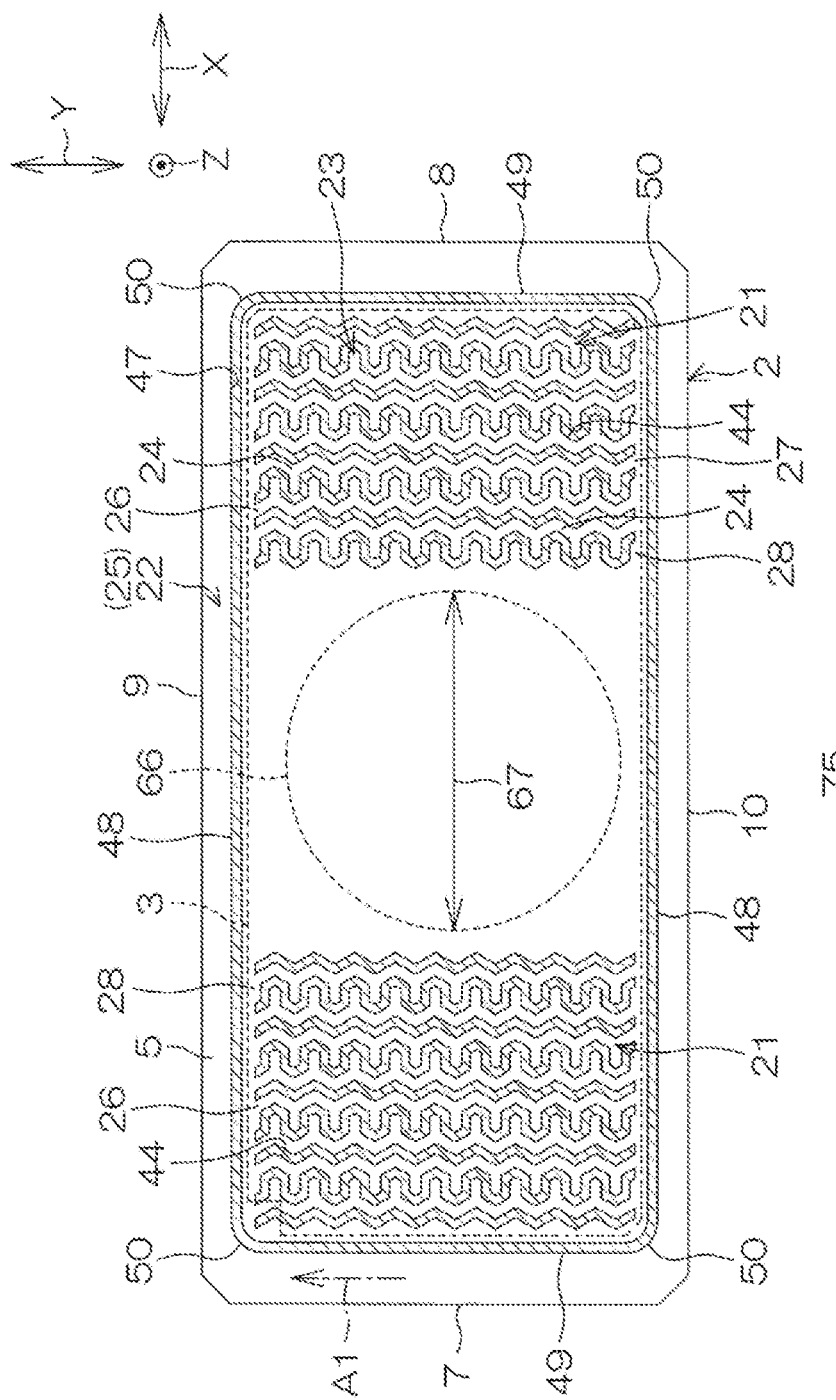
FIG. 12 is a schematic top view of the chip part.
Figure 13:
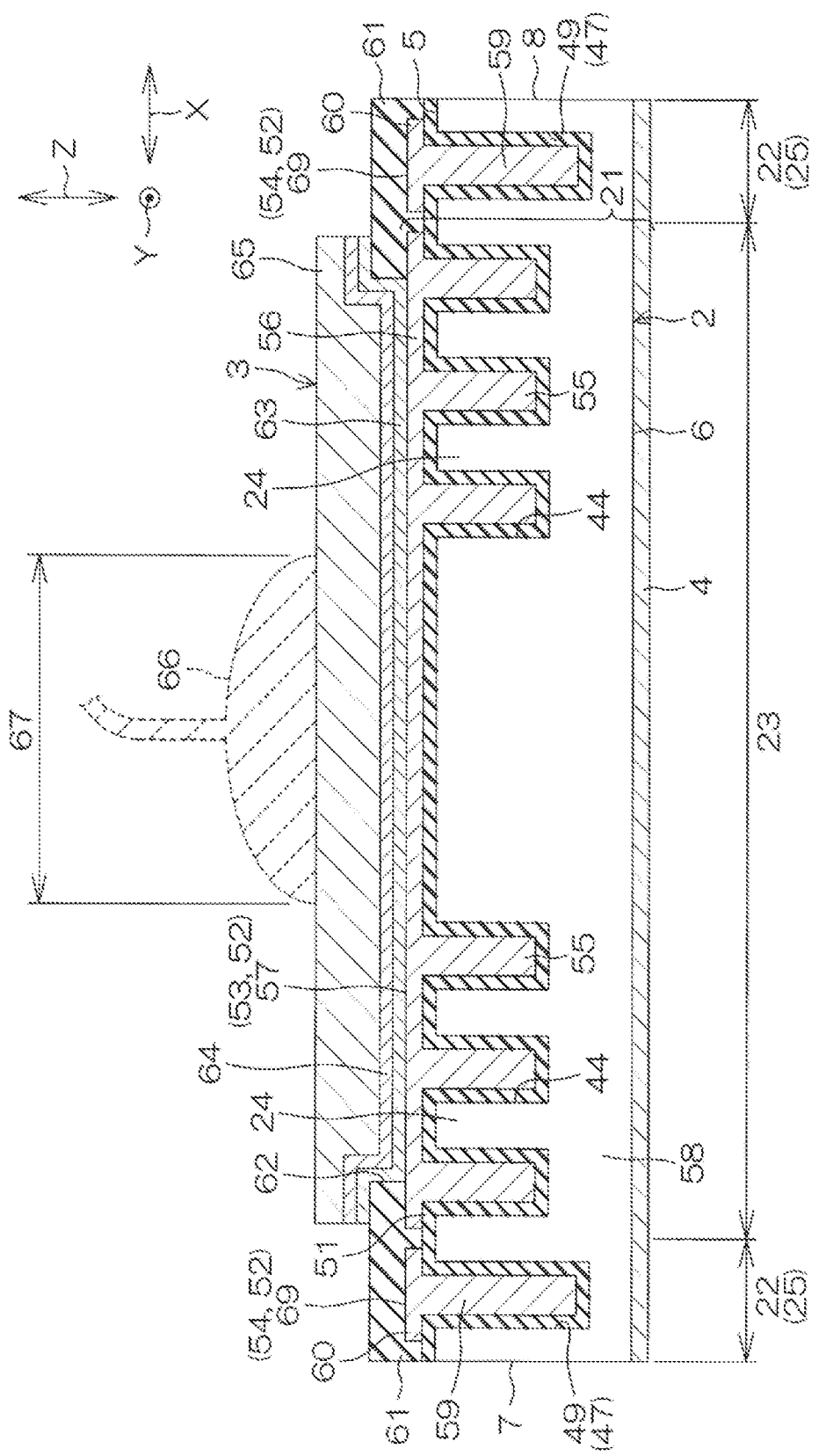
FIG. 13 is a schematic section diagram of the chip part.

FIG. 12 shows a schematic top view of the chip part 75. FIG. 13 shows a schematic section diagram of the chip part 75. In the chip part 73, the capacitor portion 21 is formed to avoid the bonding area 67 used for the bonding wire (referring to FIG. 12). That is to say, the capacitor portion 21 may not be opposite to the bonding area 67 in the thickness direction (the third direction Z) of the substrate 2 (referring to FIG. 13).

[Chip Part 76]

Figure 14:
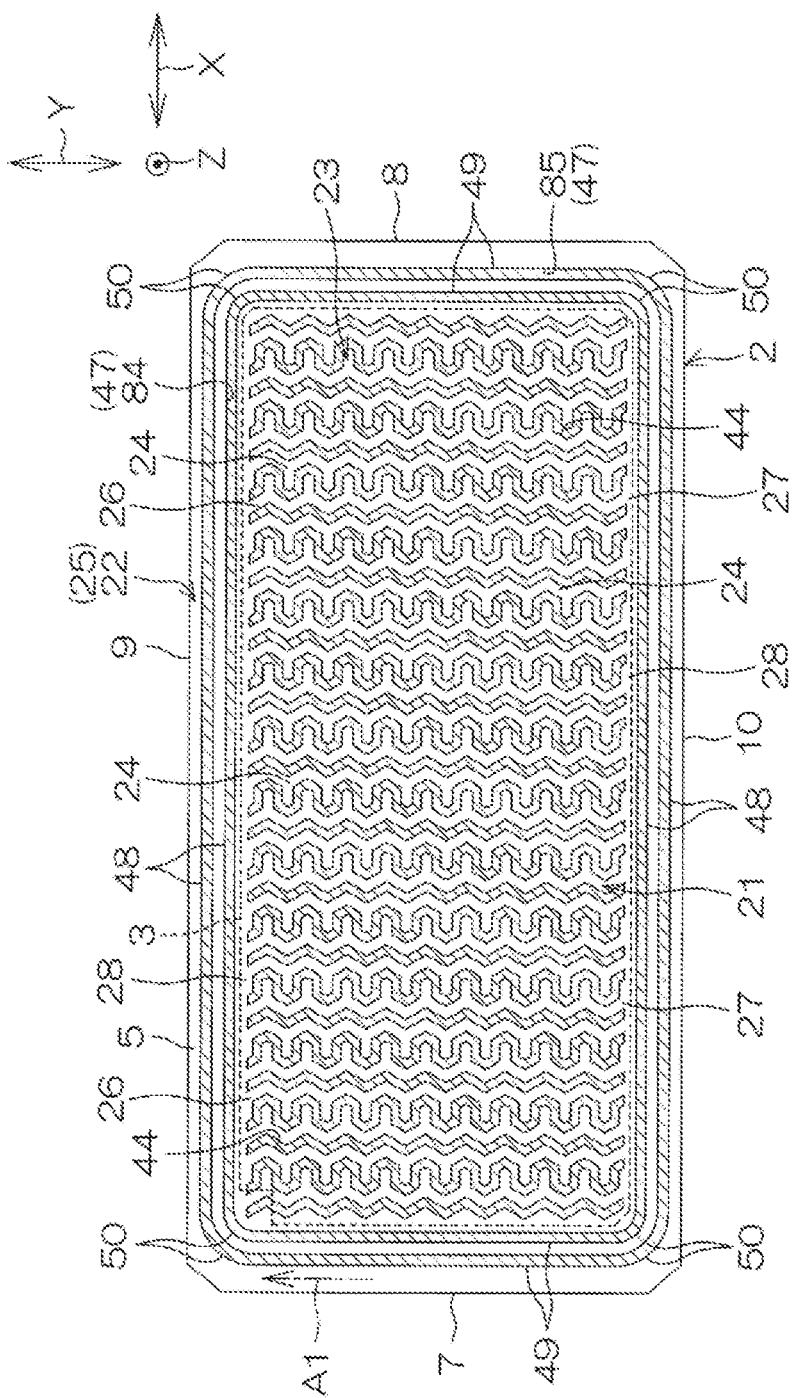
FIG. 14 is a schematic top view of the chip part.

FIG. 14 shows a schematic top view of the chip part 76. In the chip part 76, the dummy trench 47 is formed in a plurality of rows and outwardly from the capacitor portion 21 (two rows in FIG. 14). For example, a plurality of rows of dummy trenches 47 may include an inner dummy trench 84 disposed inside, and an outer dummy trench 85 disposed outside the inner dummy trench 84. In the chip part 76, the inner dummy trench 84 surrounds the capacitor portion 21, and the outer dummy trench 85 further surrounds the inner dummy trench 84. Moreover, the plurality of rows of dummy trenches 47 may also be provided in three rows or more. However, the increased in the number of rows of the dummy trenches 47 is associated with a decrease in an area used by the capacitor portion 21, and so the number of rows is preferably two or less.

[Chip Part 77]

Figure 15:
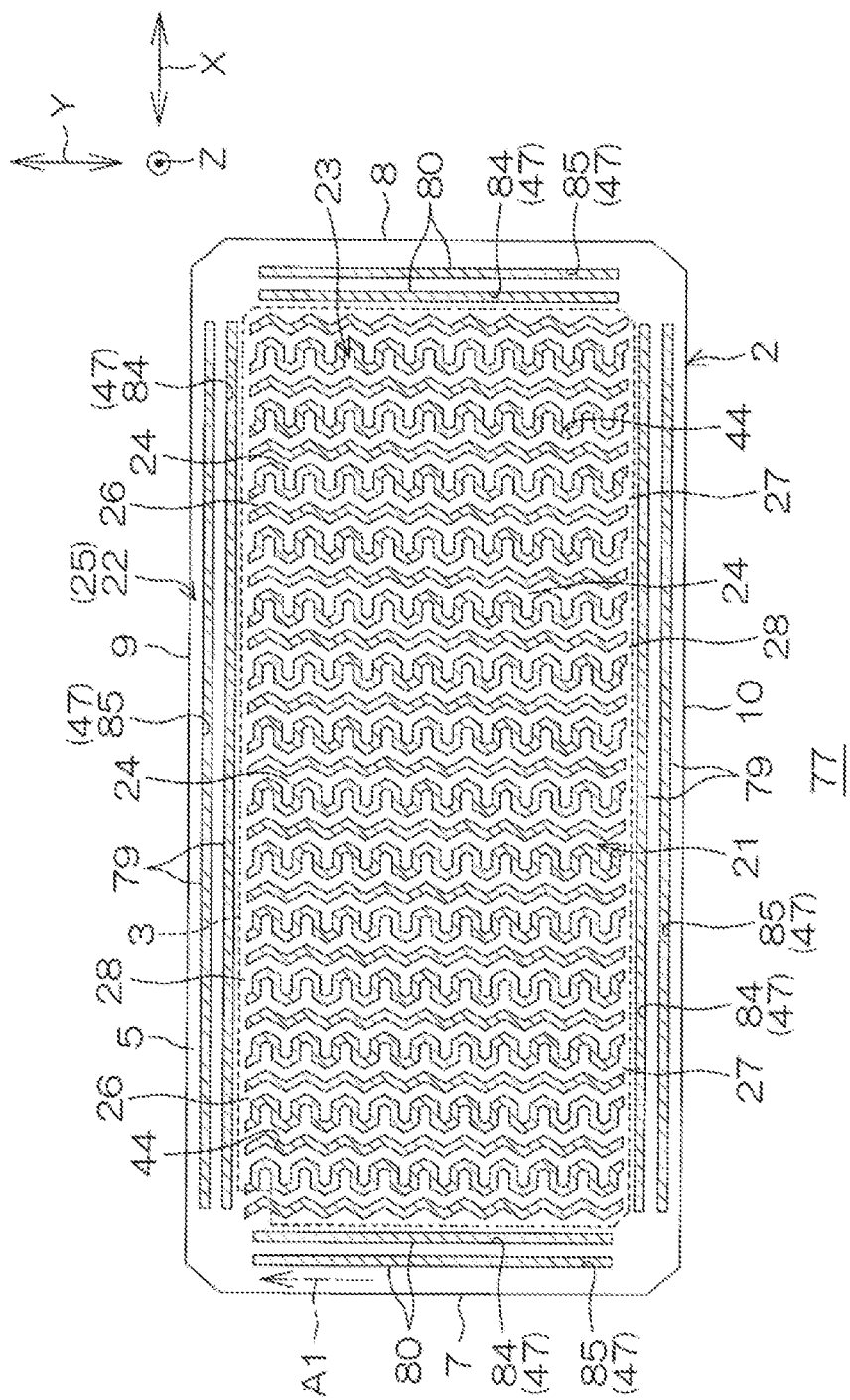
FIG. 15 is a schematic top view of the chip part.

FIG. 15 shows a schematic top view of the chip part 77. In the chip part 77, similar to the chip part 76 in FIG. 14, the dummy trench 47 (the first linear trenches 79 and the second linear trenches 80) is formed in a plurality of rows (two rows in FIG. 15) and outwardly from the capacitor portion 21.

[Chip Part 78]

Figure 16:
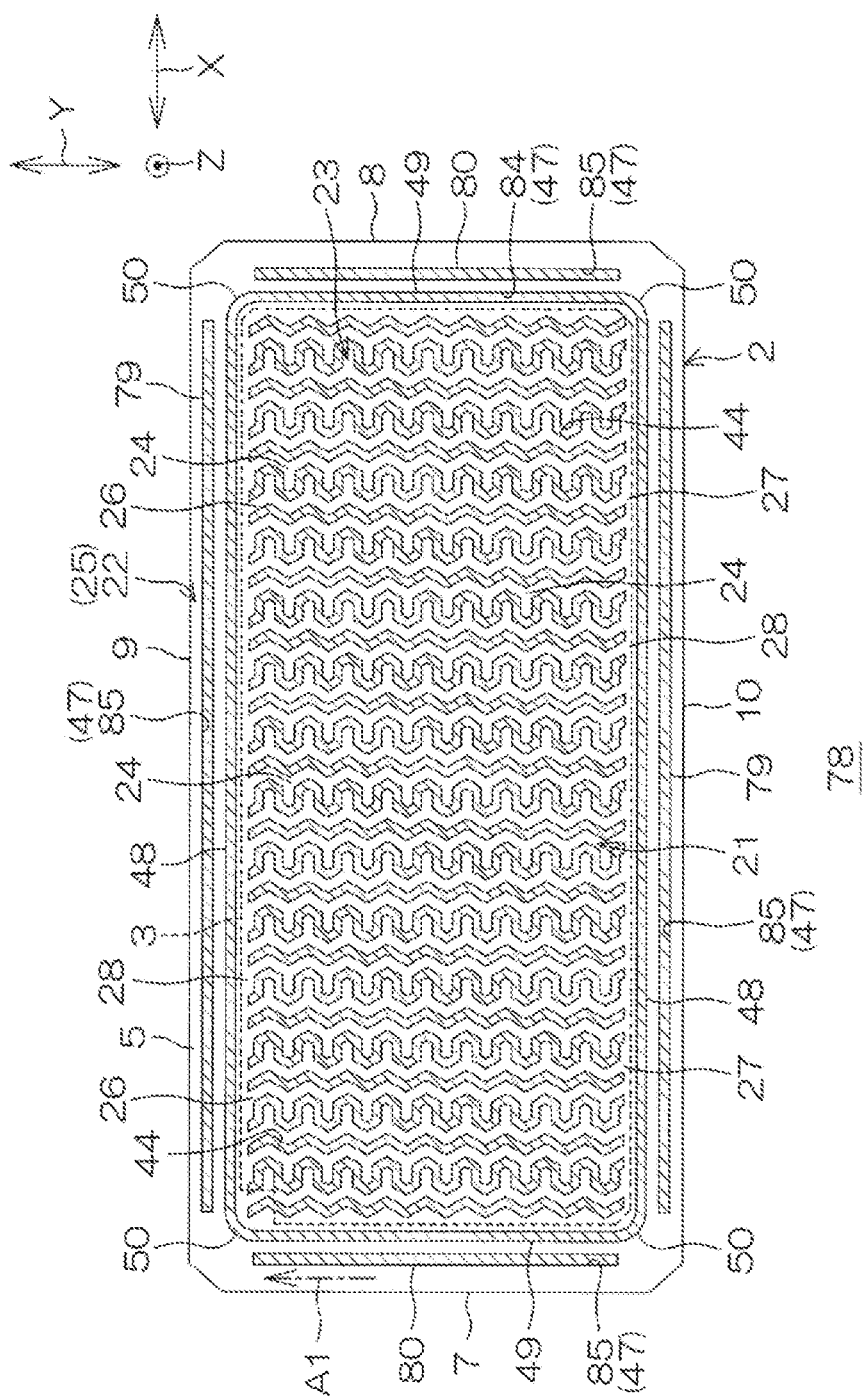
FIG. 16 is a schematic top view of the chip part.

FIG. 16 shows a schematic top view of the chip part 78. In the chip part 78, the form of the dummy trench 47 in FIG. 4 is combined with the form of the dummy trench 47 in FIG. 8. More specifically, the chip part 78 includes an annular shape dummy trench 47 surrounding the capacitor portion 21, and a dummy trench 47 disposed outside the annular shape dummy trench 47 and including the first linear trenches 79 and the second linear trenches 80. In FIG. 16, the annular shape dummy trench 47 is disposed inside the linear dummy trench 47; alternatively, the annular shape dummy trench 47 may also be disposed outside the linear dummy trench 47.

The embodiments of the present disclosure are described above; however, the present disclosure may also be implemented in other configurations.

For example, the dummy trenches 47, 81 and 82 may also be backfilled by insulators stead of such as the second embedded conductor 54.

The embodiments of the present disclosure described above are examples in all aspects and are not to be interpreted in a restrictive manner, but are intended to encompass modifications in all aspects.

The features given in the notes below can be extracted from the detailed description and the drawings of the present application.

[Note 1-1]

A chip part (1, 71 to 78) includes:
a semiconductor substrate (2), having a first main surface (5) and a second main surface (6) opposite to the first main surface (5);
a capacitor portion (21), disposed on the first main surface (5) of the semiconductor substrate (2) when viewed from a plan view and along a normal direction (n) of the first main surface (5), wherein the capacitor portion (21) includes a plurality of wall portions (24) having a lengthwise direction (A1) and separated from each other by a plurality of trenches formed on the first main surface (5);
a substrate body (25), formed around the capacitor portion (21) using a portion of the semiconductor substrate (2), and connected to at least one of one end (26) and another end (27) of the plurality of wall portions (24) in the lengthwise direction (A1);
a lower electrode (58), formed by using at least a portion of the semiconductor substrate (2) including the plurality of wall portions (24);
a capacitive film (51), disposed along top surfaces and side surfaces of the plurality of wall portions (24); and
an upper electrode (57), disposed on the capacitive film (51); wherein
the plurality of wall portions (24) are formed of a plurality of pillar units (29), each of the plurality of pillar units includes a central portion (30) and three protruding portions (31) extending from the central portion (30) to three different directions in the plan view, and the plurality of wall portions (24) are formed by connecting the three protruding portions (31) of adjacent pillar units (29)

According to the configuration, the upper electrode (57) and the semiconductor substrate (2) (the lower electrode (58)) face each other across the capacitive film (51). Thus, the vertical capacitor (21) having a laminated structure of the upper electrode (57)-capacitive film (51)-lower electrode (58) is formed in the lengthwise direction along the thickness direction of the semiconductor substrate (2). With the vertical capacitor portion (21), the external electrode (3) used for the upper electrode (57) can be disposed on the first main surface (5) and the external electrode (4) used for the lower electrode (58) can be disposed on the second main surface (6). Hence, it is not necessary to arrange these external electrodes (3 and 4) along the lateral direction of the first main surface (5) of the semiconductor substrate (2). Therefore, the lateral space of the semiconductor substrate (2) can be efficiently utilized, thereby providing the small-size chip part (1, 71 to 78).

Moreover, the wall portions (24) formed at the semiconductor substrate (2) are formed by the plurality of pillar units (29). Each of the plurality of pillar units (29) includes the central portion (30), and three protruding portions (31) extending from the central portion (30) to three different directions in the plan view. Accordingly, compared to when the wall portions (24) are formed by connecting pillars such as quadrilateral pillars (29), the surface area of the wall portions (24) can be increased. Moreover, the capacitor portion (21) is formed by imitating the surfaces of the wall portions (24). Thus, the capacitance of the capacitor portion (21) is not limited by the plane size of the semiconductor substrate (2), and a large capacitance can be realized by increasing the height of the wall portions (24). That is to say, even if the plane size of the semiconductor substrate (2) is smaller, it is ensured that the capacitor portion (21) has a larger capacitance.

In addition, if the wall portions (24) are formed by connecting the plurality of pillar units (29), the stability achieved is better than that achieved by pillar units (29) separated from each other. Further, at least one of the one end (26) and the another end (27) of each wall portion (24) is connected to the substrate body portion (25) around the wall portion (24). Thus, the wall portions (24) can be cantilevered at least from the side and therefore can be reinforced to withstand lateral forces applied to the wall portions (24). As a result, even if the height of the wall portions (24) is increased, the stability of the wall portions (24) can still be maintained, thereby enhancing component reliability.

[Note 1-2]

The chip part (68, 1, 71, 78) according to note 1-1 further includes a dummy trench (47) formed along a circumferential direction of the capacitor portion (21) or the substrate body (25).

According to the configuration, the dummy trench (47) is formed around the capacitor portion (21). Thus, when the trenches (44) and the dummy trench (47) are formed by etching the semiconductor substrate (2), compared to a forming region of the trenches (44) for the capacitor on the inside, more etching gas is supplied to a forming region of the dummy trench (47) on the outside. Therefore, for a forming region of the trenches (44) of the capacitor, etching gas can be uniformly supplied along an inward direction of the first main surface (5) of the semiconductor substrate (2). As a result, deviation in depths of the capacitor trenches (44) forming the capacitor portion (21) can be inhibited to thereby inhibit deviation between the capacitance values near the peripheral edge and a central portion of the capacitor portion (21).

[Note 1-3]

The chip part (1, 75, 76, 78) according to note 1-2 further includes an annular dummy trench (47) formed in an annular shape and surrounding the capacitor portion (21).

[Note 1-4]

In the chip part (1, 75, 76, 78) according to note 1-3, the annular dummy trench (47) is formed in a quadrilateral annular or loop shape, which integrally includes: a pair of first linear portions (48), facing each other across the capacitor portion (21) and extending along a first direction (X); and a pair of second linear portions (49), facing each other across the capacitor portion (21) and extending along a second direction (Y) crossing the first direction (X).

[Note 1-5]

In the chip part (1, 75, 76, 78) according to note 1-4, the plurality of trenches (44) are arranged in a first pitch (P1) along the first direction (X), and the pair of second linear portions (49) are separated from the plurality of trenches (44) in the first direction (X) by a second pitch (P3) having a size between 90% and 110% of the first pitch (P1).

[Note 1-6]

In the chip part (1, 75, 76, 78) according to note 1-5, the pair of first linear portions (48) are separated from the plurality of trenches (44) in the second direction (Y) by a third pitch (P2) having a size between 90% and 110% of the first pitch (P1).

[Note 1-7]

In the chip part (1, 75, 76, 78) according to any of note 1-4 to note 1-6, corners (50) of the annular dummy trench (47) which are connection points between the first linear portions (48) and the second linear portions (49), and are formed in a round shape.

[Note 1-8]

In the chip part (71 to 73, 77, 78) according to note 1-2, the dummy trench (47) includes a pair of first linear trenches (79) facing each other across the capacitor portion (21) and extending along the first direction (X).

[Note 1-9]

In the chip part (71 to 73, 77, 78) according to note 1-8, the dummy trench (47) includes a pair of second linear trenches (80) facing each other across the capacitor portion (21), extending along the second direction (Y) crossing the first direction (X), and physically separated from the pair of first linear trenches (79).

According to the configuration, the first linear trenches (79) and the second linear trenches (80) are separated from each other. Thus, portions between these trenches (79, 80) can ensure a larger thickness for the semiconductor substrate (2). Therefore, strength reliability of the chip part (71 to 73, 77, 78) can be enhanced.

[Note 1-10]

In the chip part (71 to 73, 77, 78) according to note 1-9, the plurality of trenches (44) are arranged in a first pitch (P1) along the first direction (X), and the pair of second linear trenches (80) are separated from the plurality of trenches (44) in the first direction (X) by a fourth pitch (P5) having a size between 90% and 110% of the first pitch (P1).

[Note 1-11]

In the chip part (71 to 73, 77, 78) according to note 1-10, the pair of first linear trenches (79) are separated from the plurality of trenches (44) in the second direction (Y) by a fifth pitch (P5) having a size between 90% and 110% of the first pitch (P1).

[Note 1-12]

In the chip part (1, 71 to 75) according to any of note 1-2 to note 1-11, the dummy trench (47) is formed in only one row and outwardly from the capacitor portion (21).

[Note 1-13]

in the chip part (76 to 78) according to any of note 1-2 to 1-11, the dummy trench (47) is formed in a plural of rows and outwardly from the capacitor portion (21).

[Note 1-14]

In the chip part (1, 71 to 78) according to any of note 1-2 to note 1-13, the dummy trench (47) has a width same as a width of the trench (44).

[Note 1-15]

In the chip part (1, 71 to 78) according to any of note 1-1 to note 1-14, the capacitive film (51) draws out toward a periphery of the capacitor portion (21) and further forms along an inner surface of the dummy trench (47), and the chip part (1, 71, to 78) further includes an embedded conductor (54) embedded in the dummy trench (47) through the capacitor film (51).

[Note 1-16]

In the chip part (74) according to note 1-1, in the semiconductor substrate (2), a plurality of trenches (44) are arranged along a first direction (X) crossing the lengthwise direction (A1), and the plurality of trenches (44) includes: a plurality of capacitor trenches (44), forming the capacitor portion (21); and a first dummy trench (81), arranged outside the plurality of capacitor trenches (44) in the first direction (X) and not contributive to the capacitor portion (21).

According to the configuration, the dummy trench (81) is formed outside the capacitor trenches (44). Thus, when the capacitor trenches (44) and the first dummy trench (81) are formed by etching the semiconductor substrate (2), compared to a forming region of the capacitor trenches (44) on the inside, more etching gas is supplied to a forming region of the first dummy trench (81) on the outside. Therefore, for a forming region of the capacitor trenches (44), etching gas can be uniformly supplied along an inward direction of the first main surface (5) of the semiconductor substrate (2). As a result, deviation in depths of the capacitor trenches (44) can be inhibited to thereby inhibiting deviation between the capacitance values of the trenches (44) around the capacitor trenches (44) and the trenches (44) at the center portion.

[Note 1-17]

The chip part (74) according to note 1-6 further includes a second dummy trench (82), which is interposed by a boundary portion (83) that extends across the plurality of capacitor trenches (44) in the substrate body (25) along the first direction (X), provided one for each of the plurality of capacitor trenches (44), and formed in a planar shape having continuity with a planar shape of each of the capacitor trenches (44) along the lengthwise direction (A1).

[Note 1-18]

The chip part (1, 71 to 74, 76 to 78) according to any of notes 1-1 to 1-17 includes:
  a first electrode (3), disposed on the first main surface (5) of the semiconductor substrate (2) and electrically connected to the upper electrode (57); and
  a second electrode (4), disposed on the second main surface (6) of the semiconductor substrate (2) and electrically connected to the lower electrode (58),
  wherein the first electrode (3) has a bonding area (67) directly above the capacitor portion (21) to which a bonding member (66) is bonded.

According to the configuration, the capacitor portion (21) is also disposed in a region directly below bonding area (67) of the bonding member (66). Thus, the capacitance value of the capacitor portion (21) can be increased.

[Note 1-19]

In the chip part (1, 71 to 78) according to any of note 1-1 to note 1-18, the semiconductor substrate (2) includes a silicon (Si) substrate.

[Note 1-20]

in the chip part (1, 71 to 78) according to any of note 1-1 to note 1-19, the capacitive film (51) includes at least one selected from a group including a $SiO_2$ film, SiN film, ON film, ONO film, $Al_2O_3$ film and $Ti_3O_5$ film.

The invention claimed is:

1. A chip part, comprising:
   a semiconductor substrate, having a first main surface and a second main surface opposite to the first main surface;
   a capacitor portion, disposed on the first main surface of the substrate when viewed from a plan view and along a normal direction of the first main surface, wherein the capacitor portion includes a plurality of wall portions having a lengthwise direction and separated from each other by a trench formed on the first main surface;
   a substrate body, formed around the capacitor portion using a portion of the semiconductor substrate, and connected to at least one of one end and another end of the plurality of wall portions in the lengthwise direction;
   a lower electrode, formed by using at least a portion of the semiconductor substrate including the plurality of wall portions;
   a capacitive film, disposed along top and side surfaces of the plurality of wall portions; and
   an upper electrode, disposed on the capacitive film, wherein
   the plurality of wall portions are formed of a plurality of pillar units,
   each of the plurality of pillar units includes a central portion and three protruding portions extending from the central portion to three different directions in the plan view,
   the plurality of wall portions are formed by connecting the three protruding portions of adjacent pillar units,
   the substrate body further includes a dummy trench formed along a circumferential direction of the capacitor portion, and
   the dummy trench includes an annular dummy trench formed in an annular shape and surrounding the capacitor portion.

2. The chip part of claim 1, wherein the annular dummy trench is formed in a quadrilateral annular shape, which integrally includes:
   a pair of first linear portions, facing each other across the capacitor portion and extending along a first direction; and
   a pair of second linear portions, facing each other across the capacitor portion and extending along a second direction crossing the first direction.

3. The chip part of claim 2, further comprising:
   a plurality of trenches arranged in a first pitch along the first direction, wherein the pair of second linear portions are separated from the plurality of trenches in the first direction by a second pitch having a size between 90% and 110% of the first pitch.

4. The chip part of claim 3, wherein
   the pair of first linear portions are separated from the plurality of trenches in the second direction by a third pitch having a size between 90% and 110% of the first pitch.

5. The chip part of claim 2, wherein corners of the annular dummy trench which are connection points between the first linear portions and the second linear portions, and are formed in a round shape.

6. The chip part of claim 1, wherein the dummy trench includes a pair of first linear trenches facing each other across the capacitor portion and extending along a first direction.

7. The chip part of claim 6, wherein the dummy trench includes a pair of second linear trenches facing each other across the capacitor portion, extending along a second direction crossing the first direction, and physically separated from the pair of first linear trenches.

8. The chip part of claim 7, further comprising:
a plurality of trenches arranged in a first pitch along the first direction, wherein
the pair of second linear trenches are separated from the plurality of trenches in the first direction by a fourth pitch having a size between 90% and 110% of the first pitch.

9. The chip part of claim 8, wherein
the pair of first linear trenches are separated from the plurality of trenches in the second direction by a fifth pitch having a size between 90% and 110% of the first pitch.

10. The chip part of claim 1, wherein the dummy trench is formed in only one row and outwardly from the capacitor portion.

11. The chip part of claim 1, wherein the dummy trench is formed in a plurality of rows and outwardly from the capacitor portion.

12. The chip part of claim 1, wherein the dummy trench has a same width as a width of the trench.

13. The chip part of claim 1, wherein
the capacitive film draws out toward a periphery of the capacitor portion and is further formed along an inner surface of the dummy trench, and
the chip part further includes an embedded conductor embedded in the dummy trench through the capacitor film.

14. The chip part of claim 1, wherein
in the semiconductor substrate, a plurality of trenches are arranged along a first direction crossing the lengthwise direction, and
the plurality of trenches includes:
a plurality of capacitor trenches, forming the capacitor portion; and
a first dummy trench, arranged outside the plurality of capacitor trenches in the first direction and not contributive to the capacitor portion.

15. The chip part of claim 14, further comprising a second dummy trench, which is
interposed by a boundary portion that extends across the plurality of capacitor trenches in the substrate body along the first direction,
provided one for each of the plurality of capacitor trenches, and
formed in a planar shape having continuity with a planar shape of each of the capacitor trenches along the lengthwise direction.

16. The chip part of claim 1, further comprising:
a first electrode, disposed on the first main surface of the semiconductor substrate and electrically connected to the upper electrode; and
a second electrode, disposed on the second main surface of the semiconductor substrate and electrically connected to the lower electrode,
wherein the first electrode has a bonding area directly above the capacitor portion to which a bonding member is bonded.

17. The chip part of claim 1, wherein the semiconductor substrate includes a silicon substrate.

18. The chip part of claim 1, wherein the capacitive film includes at least one selected from a group including of $SiO_2$ film, SiN film, ON film, ONO film, $Al_2O_3$ film and $Ti_3O_5$ film.

* * * * *